United States Patent
Chen et al.

(10) Patent No.: US 11,011,572 B2
(45) Date of Patent: May 18, 2021

(54) LAMINATED STRUCTURES AND ELECTRONIC DEVICES

(71) Applicant: InnoLux Corporation, Miao-Li County (TW)

(72) Inventors: Jia-Yuan Chen, Miao-Li County (TW); Tsung-Han Tsai, Miao-Li County (TW); Kuan-Feng Lee, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 16/408,849

(22) Filed: May 10, 2019

(65) Prior Publication Data
US 2020/0357826 A1    Nov. 12, 2020

(51) Int. Cl.
*H01L 27/15*    (2006.01)
*H01L 27/12*    (2006.01)

(52) U.S. Cl.
CPC ........ *H01L 27/156* (2013.01); *H01L 27/1218* (2013.01); *H01L 27/1222* (2013.01); *H01L 27/1255* (2013.01)

(58) Field of Classification Search
None
See application file for complete search history.

(56) References Cited

U.S. PATENT DOCUMENTS

| | | | | |
|---|---|---|---|---|
| 8,987,765 | B2* | 3/2015 | Bibl | H01L 25/0753 |
| | | | | 257/98 |
| 10,504,982 | B2* | 12/2019 | Lee | H01L 27/1251 |
| 10,763,451 | B2* | 9/2020 | Lius | H01L 27/1251 |
| 2010/0182223 | A1* | 7/2010 | Choi | G09G 3/3233 |
| | | | | 345/76 |
| 2014/0267683 | A1* | 9/2014 | Bibl | G09G 3/006 |
| | | | | 348/87 |
| 2014/0299842 | A1* | 10/2014 | Kim | H01L 27/3262 |
| | | | | 257/40 |
| 2014/0367633 | A1* | 12/2014 | Bibl | H01L 25/0753 |
| | | | | 257/13 |
| 2015/0001527 | A1* | 1/2015 | Tsang | H01L 27/15 |
| | | | | 257/43 |
| 2016/0351092 | A1* | 12/2016 | Chen | G09G 3/3233 |
| 2016/0372514 | A1* | 12/2016 | Chang | G09G 3/2003 |
| 2017/0271312 | A1* | 9/2017 | Kwon | H01L 25/0753 |
| 2017/0338252 | A1 | 11/2017 | Lee et al. | |
| 2018/0158987 | A1 | 6/2018 | Lee et al. | |

* cited by examiner

*Primary Examiner* — Andres Munoz
(74) *Attorney, Agent, or Firm* — McClure, Qualey & Rodack, LLP

(57) ABSTRACT

A laminated structure is provided. The laminated structure includes a light-emitting layer including a light emitting diode. The laminated structure also includes a first layer including a first thin film transistor circuit. The laminated structure further includes a second layer including a second thin film transistor circuit. The second layer is located between the light-emitting layer and the first layer. The second thin film transistor circuit includes a channel region. The light emitting diode is at least partially overlapped with the first thin film transistor circuit and not overlapped with the channel region of the second thin film transistor circuit in a top view direction of the laminated structure.

20 Claims, 17 Drawing Sheets

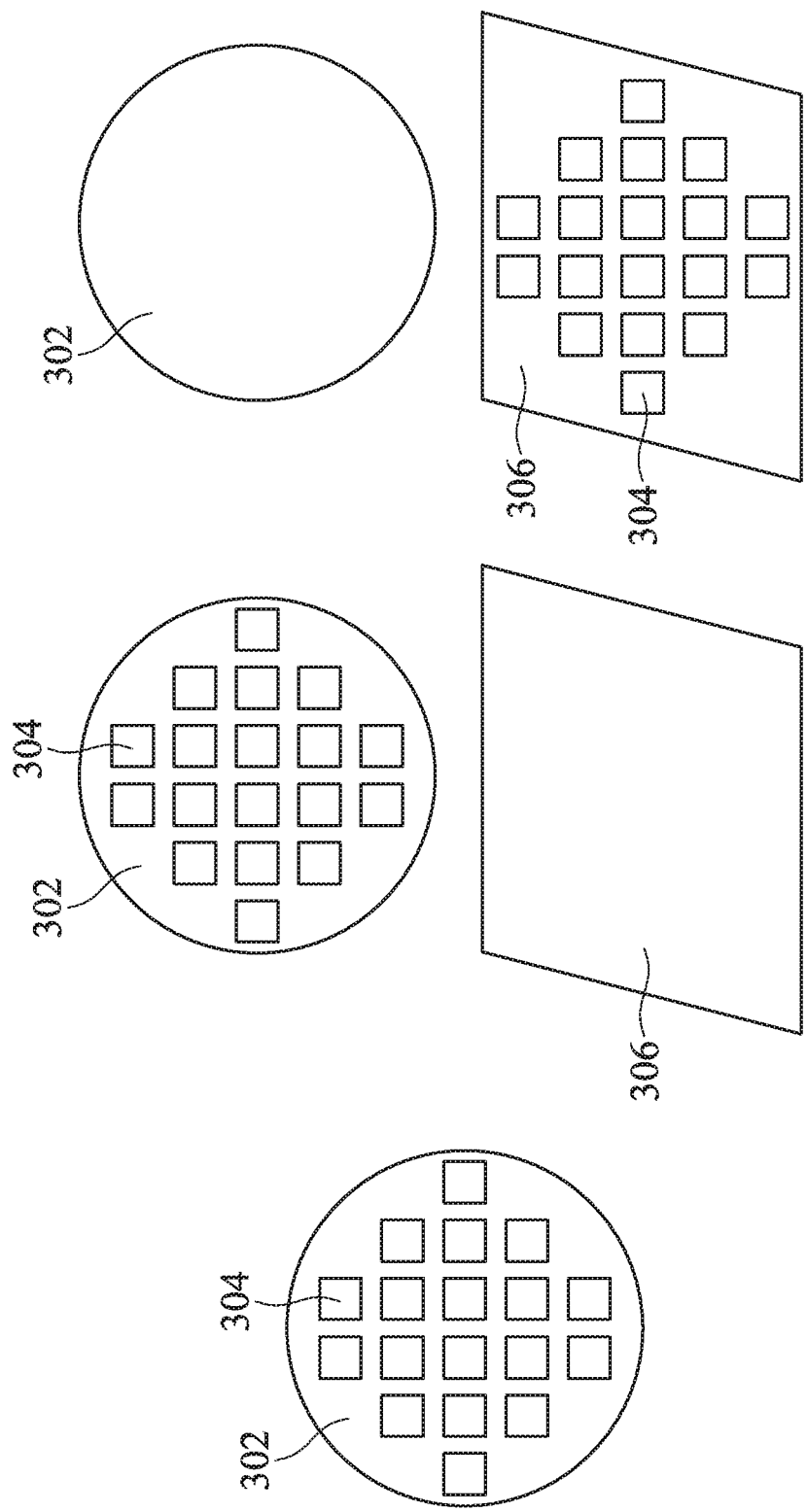

LAMINATED STRUCTURES AND ELECTRONIC DEVICES

BACKGROUND

Technical Field

The present disclosure relates to a laminated structure, and in particular to a laminated structure that includes a plurality of thin film transistors.

Description of the Related Art

Laminated structures that include a display panel, such as smartphones, tablets, notebooks, monitors, and TVs, have become indispensable necessities in modern society. With the flourishing development of such portable electronic products, consumers have high expectations regarding the quality, functionality, and price of such products. These electronic products are often provided with communications capabilities. However, some difficulties may be encountered through the use of laminated structures. Accordingly, a new laminated structure that improves display quality is needed.

SUMMARY

In accordance with some embodiments of the present disclosure, a laminated structure is provided. The laminated structure includes a light-emitting layer including a light emitting diode. The laminated structure also includes a first layer including a first thin film transistor circuit. The laminated structure further includes a second layer including a second thin film transistor circuit. The second layer is located between the light-emitting layer and the first layer. The second thin film transistor circuit includes a channel region. The light emitting diode is at least partially overlapped with the first thin film transistor circuit and not overlapped with the channel region of the second thin film transistor circuit in a top view direction of the laminated structure.

In accordance with some embodiments of the present disclosure, an electronic device is provided. The electronic device includes a plurality of pixels. At least one of the pixels includes a laminated structure. The laminated structure includes a light-emitting layer including a light emitting diode. The laminated structure also includes a first layer including a first thin film transistor circuit. The laminated structure further includes a second layer including a second thin film transistor circuit. The second layer is located between the light-emitting layer and the first layer. The second thin film transistor circuit includes a channel region. The light emitting diode is at least partially overlapped with the first thin film transistor circuit and not overlapped with the channel region of the second thin film transistor circuit in a top view direction of the laminated structure.

A detailed description is given in the following embodiments with reference to the accompanying drawings.

BRIEF DESCRIPTION OF THE DRAWINGS

The disclosure may be understood by reading the subsequent detailed description and examples with references made to the accompanying drawings, wherein:

FIGS. 15A-15C illustrate top views of different stages of a process for manufacturing an electronic device in accordance with some embodiments of the present disclosure.

DETAILED DESCRIPTION

Figures 1A, 1B:
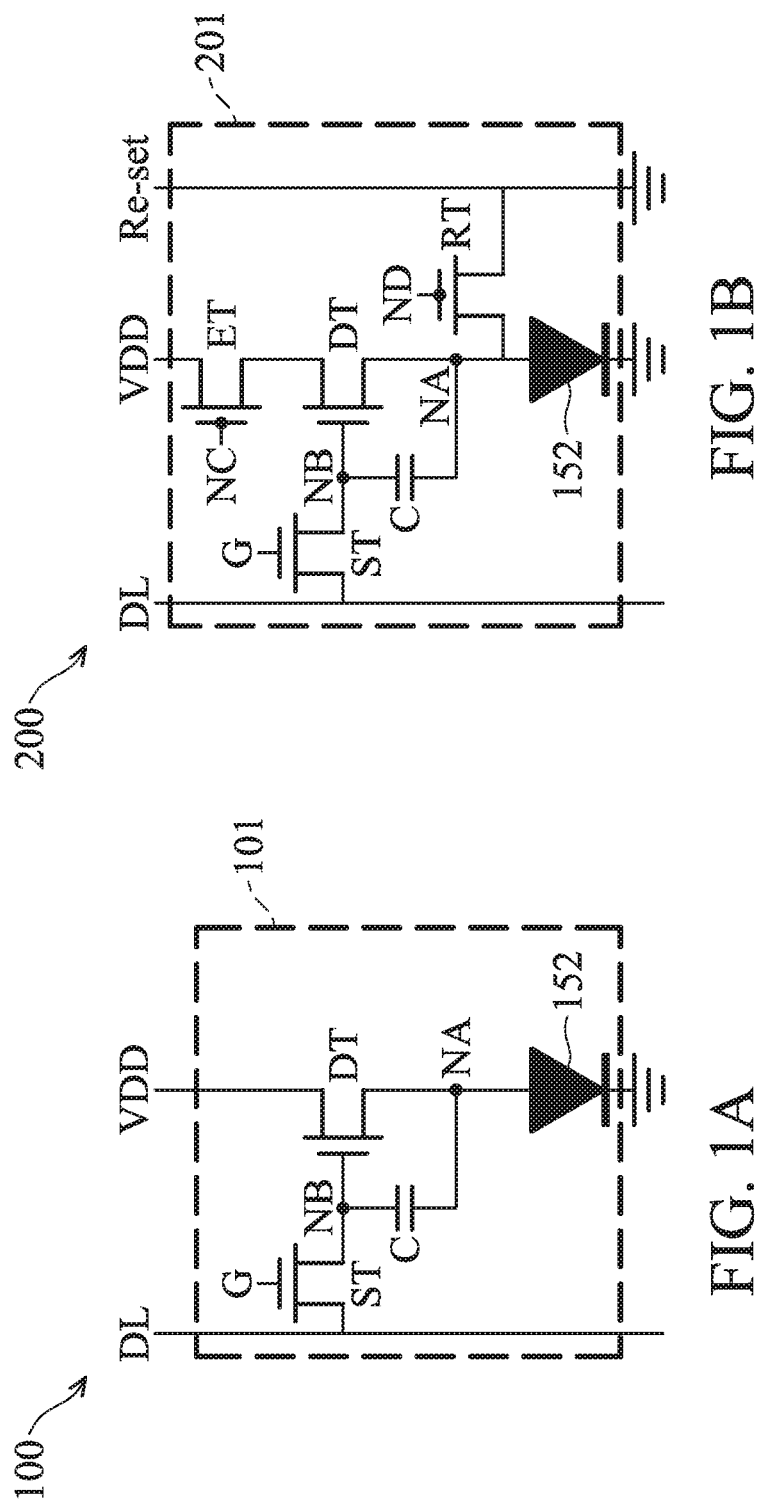
FIGS. 1A and 1B illustrate circuit diagrams of laminated structures in accordance with some embodiments of the present disclosure.

The laminated structure of the present disclosure and the manufacturing method thereof are described in detail in the following description. In the following detailed description, for purposes of explanation, numerous specific details and embodiments are set forth in order to provide a thorough understanding of the present disclosure. It will be apparent, however, that the exemplary embodiments set forth herein are used merely for the purpose of illustration, and the inventive concept may be embodied in various forms without being limited to those exemplary embodiments. In addition, the drawings of different embodiments may use like and/or corresponding numerals to denote like and/or corresponding elements. However, the use of like and/or corresponding numerals in the drawings of different embodiments does not suggest any correlation between different embodiments. In addition, in this specification, expressions such as "first material layer disposed/located above/on/over a second material layer", may indicate the direct contact of the first material layer and the second material layer, or it may indicate a non-contact state with one or more intermediate layers between the first material layer and the second material layer. In the above situation, the first material layer may not be in direct contact with the second material layer.

In addition, in this specification, relative expressions are used. For example, "upper" or "lower" is used to describe the position of one element relative to another. It should be appreciated that if a device is flipped upside down, an element that is on the "bottom" will become an element that is on the "top".

It should be understood that, although the terms first, second, third etc. may be used herein to describe various elements, components, regions, layers, portions and/or sections, these elements, components, regions, layers, portions and/or sections should not be limited by these terms. These terms are only used to distinguish one element, component, region, layer, portion or section from another element, component, region, layer, portion or section. Thus, a first element, component, region, layer, portion or section discussed below could be termed a second element, component, region, layer, portion or section without departing from the teachings of the present disclosure.

It should be understood that this description of the exemplary embodiments is intended to be read in connection with the accompanying drawings, which are to be considered part of the entire written description. The drawings are not drawn to scale. In addition, structures and devices are shown schematically in order to simplify the drawing. In the drawings, some components may be omitted for clarity. Moreover, some components in the drawings may be eliminated as another embodiment of the present disclosure.

The terms "about" and "substantially" typically mean +/−20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. When there is no specific description, the stated value includes the meaning of "about" or "substantially". Moreover, when considering the deviation or the fluctuation of the manufacturing process, the term "same" may also include the meaning of "about" or "substantially".

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

In addition, in some embodiments of the present disclosure, terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

In addition, the phrase "in a range from a first value to a second value" indicates the range includes the first value, the second value, and other values in between.

In addition, the term "cover" includes the meaning of "cover partially" or "cover completely".

Refer to FIGS. 1A and 1B, which illustrate circuit diagrams of laminated structures 100 and 200 in accordance with some embodiments of the present disclosure. The embodiments shown in FIGS. 2, 4, 5, 6, 7 and 8 may correspond to the circuit diagram of the laminated structure 100; the embodiments shown in FIGS. 9, 10, 11, 12, 13 and 14 may correspond to the circuit diagram of the laminated structure 200. However, the scope of the disclosure is not intended to be limited.

As shown in FIG. 1A, the laminated structure 100 may include a plurality of pixels 101, and at least one of the plurality of pixels 101 may include at least two transistors, one capacitor and one light-emitting diode 152. The laminated structure 100 may include a driving transistor DT. The driving transistor DT may be used to determine whether the light-emitting diode 152 is turned on or not. The driving transistor DT may be electrically connected to a drain voltage VDD. The laminated structure 100 may include a switch transistor ST. The switch transistor ST may be used to determine whether the driving transistor DT is turned on or not. The switch transistor ST may be electrically connected to a data line DL and a gate terminal. The laminated structure 100 may include a capacitor C. The capacitor may be electrically coupled to the switch transistor ST and the driving transistor DT through nodes NA and NB. The switch transistor ST may be electrically connected to the driving transistor DT through the node NB. The light-emitting diode 152 is electrically connected to the driving transistor DT through the node NA. To be noted that the circuit diagram of the laminated structure 100 is merely an exemplary, and the scope of the disclosure is not intended to be limited. In some embodiments, the laminated structure 100 may further include other active and passive elements.

Figure 2:
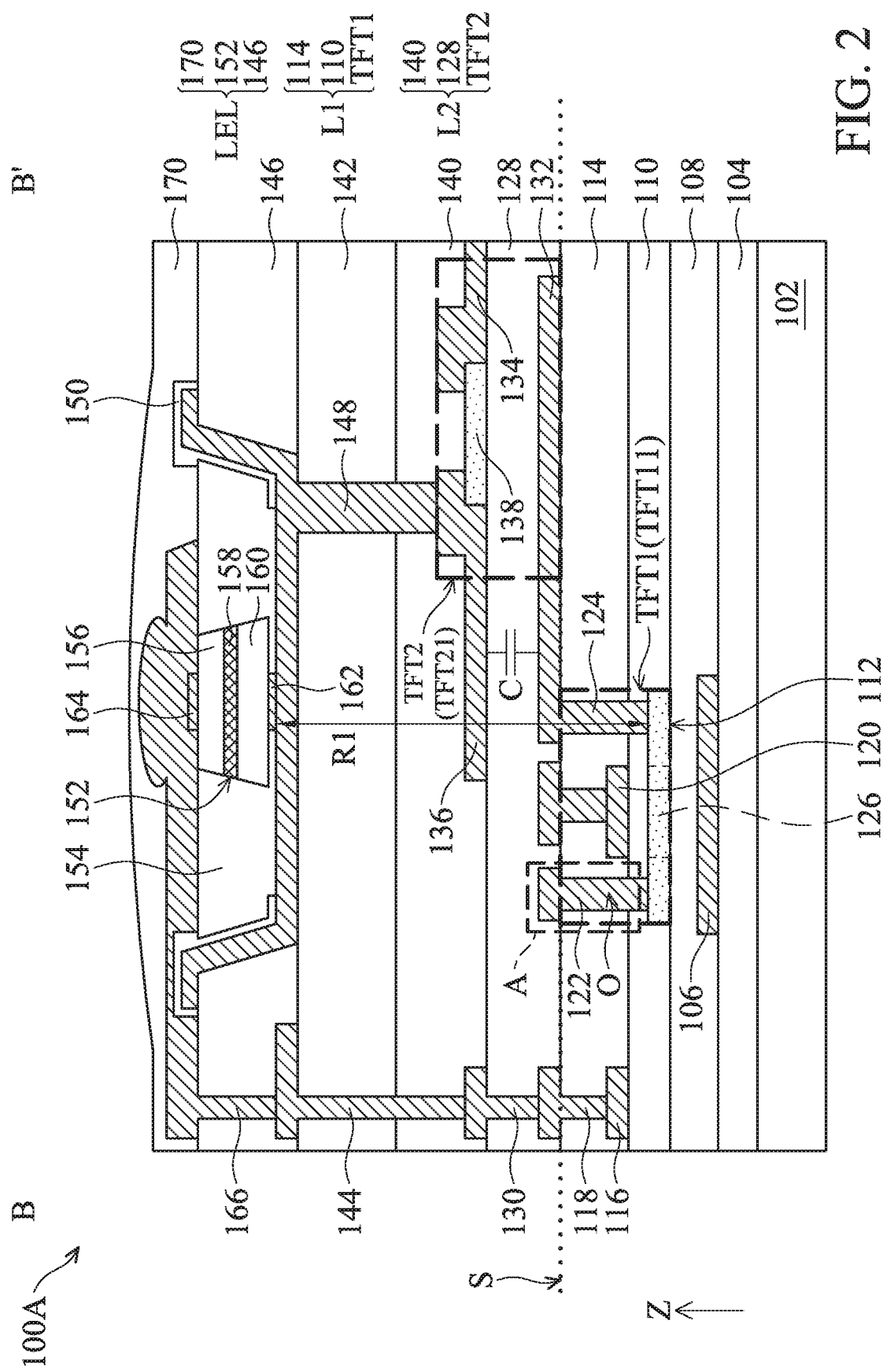
FIG. 2 illustrates a cross-sectional view of a laminated structure in accordance with some embodiments of the present disclosure.
Figure 3:
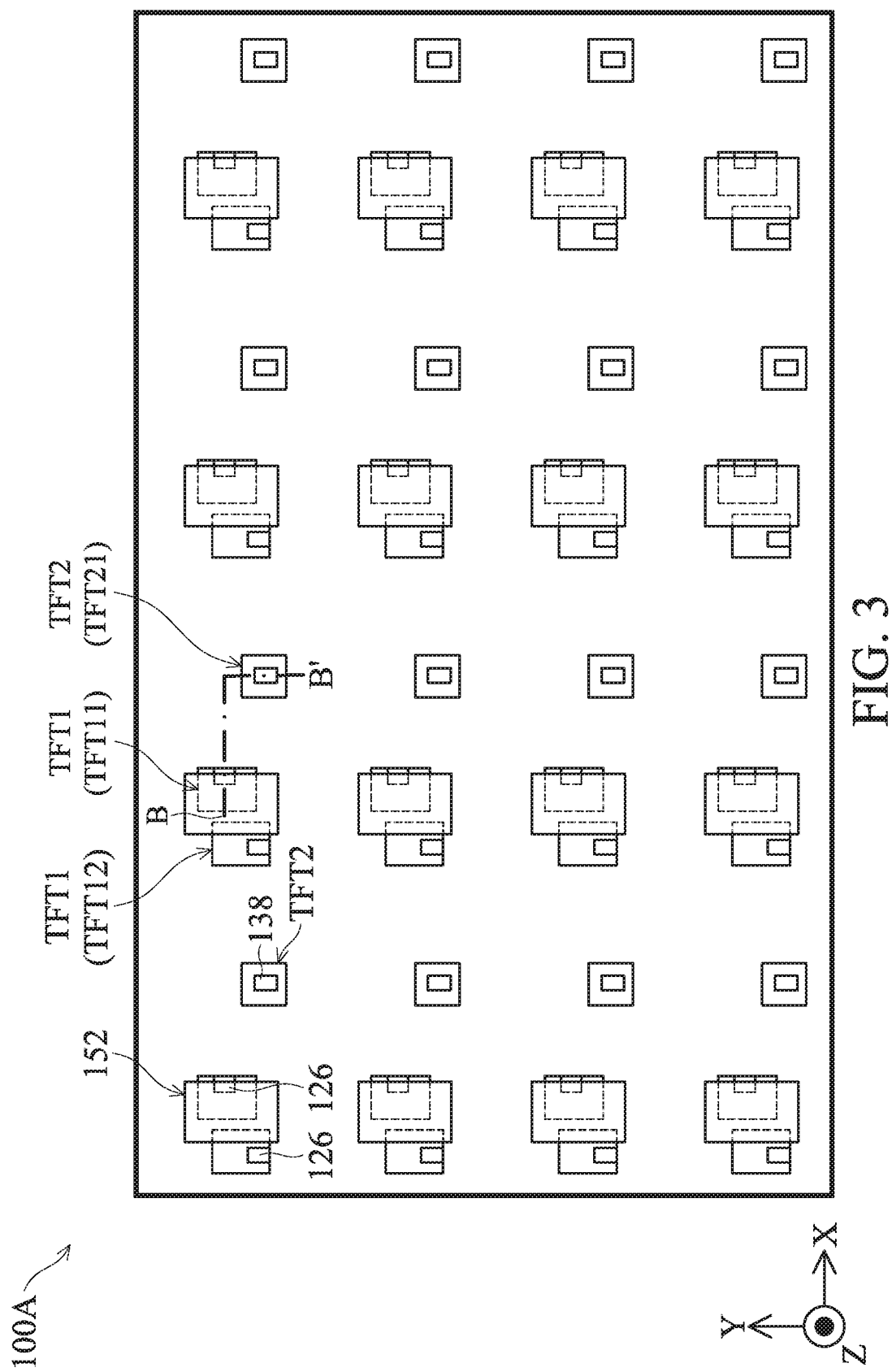
FIG. 3 illustrates a top view of the laminated structure shown in FIG. 2 in accordance with some embodiments of the present disclosure.

Refer to FIG. 2 and FIG. 3, FIG. 2 illustrates a cross-sectional view of a laminated structure 100A in accordance with some embodiments of the present disclosure, and FIG. 3 illustrates a top view of the laminated structure 100A shown in FIG. 2. The line B-B' of FIG. 3 may correspond to the cross-sectional view shown in FIG. 2. Refer to FIG. 2, the laminated structure 100A may include a substrate 102. The substrate 102 may include a hard substrate or a flexible substrate. The material of the substrate 102 may include a glass, a ceramic, a polymer, other suitable material, or a combination thereof. The laminated structure 100A may include a buffer layer 104. The laminated structure 100A may include a metal layer 106 disposed on the buffer layer 104. The material of the buffer layer 104 may include, but is not limited to, silicon nitride ($SiN_x$), silicon oxide ($SiO_y$), silicon oxynitride (SiON) or another suitable material. For example, the buffer layer 104 may include a multi-layer structure of $SiN_x/SiO_y/SiN_x/SiO_y$, and the thickness of each layer may be different of the same, and may be in a range between 500 Å and 1500 Å.

The laminated structure 100A may include a passivation layer 108 disposed on the buffer layer 104. The material of the passivation layer 108 may include, but is not limited to, silicon nitride, silicon oxide, silicon oxynitride or another suitable material. For example, the passivation layer 108 may include a silicon oxide layer whose thickness is in a range between 2000 Å and 4000 Å.

In some embodiments, the laminated structure 100A may include the first thin film transistor circuit TFT1. Although FIG. 2 only illustrates one first thin film transistor TFT11, such as the switch transistor ST, for brevity, the first thin film transistor circuit TFT1 may include a plurality of first thin film transistors TFT11. The first thin film transistors TFT11 may include a gate 120, a source/drain (S/D) region 122, a S/D region 124 and an semiconductor layer 112. The semiconductor layer 112 of the first thin film transistor TFT11 is disposed on the passivation layer 108. The material of the semiconductor layer 112 may include, but is not limited to, amorphous-Si, poly-Si, germanium; a compound semiconductor which may include gallium nitride (GaN), silicon carbide, gallium arsenide, gallium phosphide, indium phosphide, indium arsenide and/or indium antimonide; an alloy semiconductor which may include SiGe alloy, GaAsP alloy, AlInAs alloy, AlGaAs alloy, GaInAs alloy, GaInP alloy, GaInAsP alloy, or a combination thereof. The material of the semiconductor layer 112 may also include, but is not limited to, metal oxide such as indium gallium zinc oxide (IGZO), indium zinc oxide (IZO), indium gallium zinc oxide (IGZTO), or organic semiconductor including polycyclic aromatic compound, or a combination thereof. In some embodiments, the semiconductor layer 112 may be doped with p-type or n-type dopants.

The laminated structure 100A may include a gate insulating layer 110 disposed on the passivation layer 108. The material of the gate insulating layer 110 may include silicon oxide or other suitable insulating material. The thickness of the gate insulating layer 110 may be in a range between 1000 Å and 1500 Å. The gate 120 may be disposed on the gate insulating layer 110, and the S/D regions 122 and 124 may be disposed on two opposite sides of the gate 120. The material of the S/D regions 122 and 124, such as metal material, may be disposed in the opening O of the passivation layer 114. The S/D regions 122 and 124 are electrically connected to the semiconductor layer 112. The laminated structure 100A may include a passivation layer 114 disposed on the gate insulating layer 110. The material of the passivation layer 114 may include, but is not limited to, silicon nitride, silicon oxide, silicon oxynitride, aluminum oxide or another suitable material. For example, the passivation layer 114 may include a multi-layer structure that comprises two silicon oxide layers and one silicon nitride layer disposed between them. The silicon oxide layers may have the thickness in a range between 2000 Å A and 4000 Å and between 1000 Å and 2000 Å, respectively. The silicon nitride layer may have the thickness in a range between 1000 Å and 2000 Å.

As shown in FIGS. 1A and 2, the S/D region 122 may be electrically connected to the data line; the S/D region 124 may be electrically connected to the gate of the second thin film transistor circuit TFT2. It should be appreciated that the region of the semiconductor layer 112 that overlaps the gate 120 may be defined as the channel region 126 of the first thin film transistor TFT11 in this disclosure. The portion of the semiconductor layer 112 that marked by dotted line is the channel region 126. In addition, the term "overlap" is judged along a direction that is orthogonal to the substrate 102, such as the Z direction in this cross-sectional plane. In other embodiment, a portion of the semiconductor layer 112 may be doped with dopants by doping or treatment process. Therefore, the portions of the semiconductor layer 112 out of the channel region 126 may be used as the source and/or the drain.

In some embodiments, the metal layer 106 may be used to reduce affection of light of the surrounding on the first thin film transistor TFT11. In some embodiments, the metal layer 106 may be used as a bottom gate of the first thin film transistor TFT11. In this case, the first thin film transistor TFT11 includes the metal layer 106, which may function as the bottom gate. The metal layer 106 may include, but is not limited to, copper (Cu), aluminum (Al), molybdenum (Mo), tungsten (W), gold (Au), chromium (Cr), nickel (Ni), platinum (Pt), titanium (Ti) or another suitable metal material.

The laminated structure 100A may include a metal layer 116 disposed on the insulating layer 110 layer. The metal layers 116 may include, but is not limited to, copper (Cu), aluminum (Al), molybdenum (Mo), tungsten (W), gold (Au), chromium (Cr), nickel (Ni), platinum (Pt), titanium (Ti) or another suitable metal material. In this embodiments, the metal layer 116 may be used as a gate of the first thin film transistor circuit TFT1. In addition, the metal layer 116 may be electrically connected to a common voltage (not shown).

In some embodiments, the laminated structure 100A may include the second thin film transistor circuit TFT2. Although FIG. 2 only illustrates one second thin film transistor TFT21, such as the driving transistor DT, for brevity, the second thin film transistor circuit TFT2 may include a plurality of second thin film transistors TFT21. The second thin film transistor circuit TFT2 may be disposed on the first thin film transistor circuit TFT1. The second thin film transistors TFT21 may include a gate 132, a S/D region 134, a S/D region 136 and an semiconductor layer 138. The material of the semiconductor layer 138 may be similar to or the same as that of the semiconductor layer 112. In some embodiments, the thickness of the semiconductor layer 138 of the channel region may be in a range between 300 Å and 600 Å. The gate 132 may be disposed on the passivation layer 114, and the S/D region 134 and the S/D region 136 may be electrically connected to the semiconductor layer 138. The material of the semiconductor layer 138 may be similar to or the same as that of the semiconductor layer 112. In this embodiments, the semiconductor layer 138 overlap the gate 132 completely, so the semiconductor layer 138 may be regarded as a channel region.

The laminated structure 100A may include a metal layer 118 disposed on the metal layer 108 layer. The metal layer 118 may be used as a source and/or a drain of a first thin film transistor circuit TFT1. The metal layer 118 may further be used as a gate of a second thin film transistor circuit TFT2. However, the scope of the disclosure is not intended to be limited. In this embodiment, the metal layer, such as metal layer 118, of the S/D regions 122 and 124 may include a multi-layer structure. For example, the metal layer of the S/D regions 122 and 124 may include a single metal layer or multi-layers, the material of the metal layer may include copper (Cu), aluminum (Al), molybdenum (Mo), tungsten (W), gold (Au), chromium (Cr), nickel (Ni), platinum (Pt), titanium (Ti), other suitable metal material, or combination thereof. The laminated structure 100A may include a passivation layer 128 disposed on the passivation layer 114. The material of the passivation layer 128 may include inorganic material, such as silicon nitride, silicon oxide, silicon oxynitride or another suitable material. The material of the passivation layer 128 may include organic material, such as perfluoroalkoxy alkanes (PFA). For example, the passivation layer 128 may include a silicon oxide layer with thickness in a range between 2500 Å and 5000 Å.

The laminated structure 100A may include a metal layer 130 disposed on the metal layer 118. The material of the metal layer 130 may be similar to or the same as that of the metal layer 118. In some embodiments, the metal layer 130 may be used as a source and/or a drain of the second thin film transistor circuit TFT2. However, the scope of the disclosure is not intended to be limited. In this embodiment, the metal layer, such as the metal layer 130, of the S/D regions 134 and 136 may include a multi-layer structure. For example, the metal layer of the S/D regions 134 and 136 may include a single metal layer or multi-layers. The material of the metal layer may include such as copper (Cu), aluminum (Al), molybdenum (Mo), tungsten (W), gold (Au), chromium (Cr), nickel (Ni), platinum (Pt), titanium (Ti) or another suitable metal material. In addition, the S/D regions 134 and 136 may include a multi-layer metal structure, such as a structure of Ti/Al/Ti. In addition, as shown in FIG. 2, the capacitor C may be composed of the gate 132, the passivation layer 128 and the S/D region 136 in accordance with some embodiments.

The laminated structure 100A may include an insulation layer 140 disposed on the passivation layer 128; the planarization layer 142 may be disposed on the insulation layer 140. The material of the insulation layer 140 and the planarization layer 142 may include, but is not limited to, silicon nitride, silicon oxide, silicon oxynitride or another suitable material. In addition, the material of the insulation layer 140 and the planarization layer 142 may include organic material, such as perfluoroalkoxy alkanes (PFA). For example, the insulation layer 140 may include a silicon oxide layer with thickness in a range between 2000 Å and 4000 Å; the planarization layer 142 may include a silicon oxide layer with thickness in a range between 1 μm and 5 μm.

The laminated structure 100A may include a metal layer 144 disposed on the metal layer 130. The material of the metal layer 144 may be similar to or the same as the metal layer 118.

In some embodiments, the laminated structure 100A may include a first layer L1 and a second layer L2. The second layer L2 may be disposed above the first layer L1. For example, the first layer L1 includes the first thin film transistor circuit TFT1, and the second layer L2 includes the second thin film transistor circuit TFT2. In some embodiments, the first layer L1 further may include at least a portion of the gate insulating layer 110 and at least a portion of the insulation layer 114; the second layer L2 further may include at least a portion of the passivation layer 128 and at least a portion of the insulation layer 140. The virtual interface S located between the passivation layer 128 and the insulation layer 114 may be an interface of the first layer L1 and the second layer L2. The interface mentioned above may be an uneven surface or a planar surface. However, the scope of the disclosure is not intended to be limited. The labels of the first layer L1 and the second layer L2 are merely exemplary, and the scope of the disclosure is not intended to be limited. In some embodiments, the metal layer 106 may be used to reduce the affection of light of the surrounding on the first thin film transistor TFT11. In this embodiment, the metal 106 is disposed under the first layer L1 and overlaps the first thin film transistor TFT11. In some embodiments, when the metal layer 106 is used as the gate of the first thin film transistor circuit TFT1, the first layer L1 may further include at least a portion of the passivation layer 108.

The relative position between the first thin film transistor circuit TFT1 and the second thin film transistor circuit TFT2 may be defined by their semiconductor layers. For example, as shown in FIG. 2, the region marked by dotted line that includes the semiconductor layer 112, the corresponding portions of the gate 120, the S/D regions 122 and 124, may be regarded as the first thin film transistor circuit TFT1; the region marked by dotted line that includes the semiconductor layer 138, the corresponding portions of the gate 132, the S/D regions 134 and 136, may be regarded as the second thin film transistor circuit TFT2. To be noted that one layer may have one portion that belong to the first layer L1, and have another one portion that belong to the second layer L2. To be noted that when the metal layer 118 could be used as the source and/or the drain of the first thin film transistor circuit TFT1 and the gate of the second thin film transistor circuit TFT2, the first thin film transistor circuit TFT1 and the second thin film transistor circuit TFT2 may be defined by the virtual interface S between the first layer L1 and the second layer L2. Therefore, the first thin film transistor circuit TFT1 and the second thin film transistor circuit TFT2 may be defined as in different layers. To be noted that the semiconductor layer of the second thin film transistor circuit TFT2 of the second layer L2 is located over the semiconductor layer of the first thin film transistor circuit TFT1 of the first layer L1.

Figure 2A:
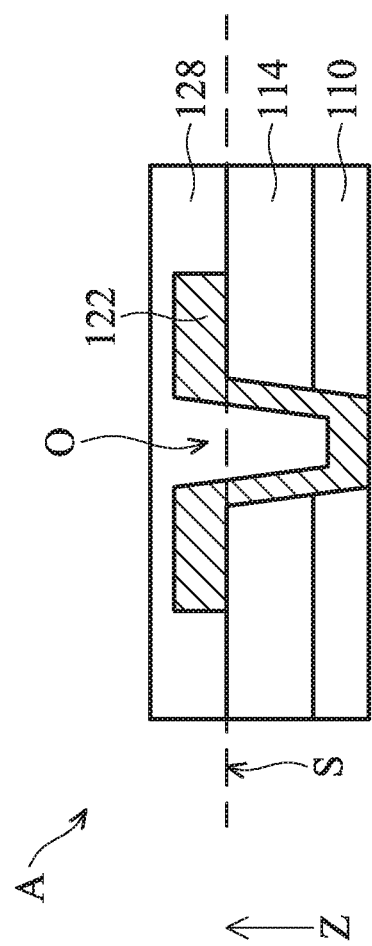
FIG. 2A illustrates a partial enlarged view of the laminated structure shown in FIG. 2 in accordance with some embodiments of the present disclosure.

Refer to FIG. 2A, which illustrates a partial enlarged view of the region A of the laminated structure 100A in accordance with some embodiments of the present disclosure. In some embodiments, passivation layer 114 or insulating layer 110 may have an opening O. The passivation layer 128 may be disposed in the opening O. The S/D region 122 may be disposed in the opening O. In this embodiment, the virtual interface S in the region A between the passivation layer 114 and the passivation layer 128 may be used to define the boundary of the first thin film transistor circuit TFT1.

To be noted that the region labeled as the first thin film transistor circuit TFT1 and/or the second thin film transistor circuit TFT2 is merely an exemplary, and the scope of the disclosure is not intended to be limited. For example, when the metal layer 106 is used as the gate of the first thin film transistor circuit TFT1, the first thin film transistor circuit TFT1 includes a portion of metal layer 106.

The laminated structure 100A may include a pixel define layer 146 disposed on the planarization layer 142. The material of the pixel define layer 146 may include an organic material, an inorganic material or a combination thereof. In some embodiments, the thickness of the pixel define layer 146 is in a range between 1 μm and 3 μm. The laminated structure 100A may include a conductive layer 148 disposed on the passivation layer 128 layer. The conductive layer 148 may be conformally formed on the surface, such as top and side surface, of the pixel define layer 146. The material of the conductive layer 148 may include, but is not limited to, copper (Cu), aluminum (Al), molybdenum (Mo), tungsten (W), gold (Au), chromium (Cr), nickel (Ni), platinum (Pt), The material of the conductive layer 148 may include other conductive material, such as ITO or IZO. The laminated structure 100A may include a light-emitting diode 152. The pixel define layer 146 may be patterned and have an opening on which the light-emitting diode 152 is disposed. The conductive layer 148 may be used to electrically connect the second thin film transistor circuit TFT2 and the light-emitting diode 152.

In addition, the light-emitting diode 152 is surrounded by a filling layer 154. The light-emitting diode 152 may be a micro light-emitting diode (μLED). The size of the chip of the μLED may be in a range of about 1 μm to about 100 μm. The light-emitting diode 152 can be a mini light-emitting diode. The size of the chip of the mini LED may be in a range of about 100 μm to about 300 μm. However, the scope of the disclosure is not intended to be limited. The recombination of electron and hole in the light-emitting diode may produce electromagnetic radiation (such as light) through the current at the p-n junction. For example, in the forward bias p-n junction formed by direct band gap materials such as GaAs or GaN, the recombination of electron and hole injected into the depletion region results in electromagnetic radiation. The aforementioned electromagnetic radiation may lie in the visible region or the non-visible region. Materials with different band gaps may be used to form light-emitting diodes of different colors.

In some embodiments, the light-emitting diode 152 may include a semiconductor layer 156, a quantum well layer 158 and a semiconductor layer 160 disposed between them. The semiconductor layer 156 may provide holes, and the semiconductor layer 160 may provide electrons. As a result, the holes and the electrons recombine to generate electromagnetic radiation. The semiconductor layer 156 and the semiconductor layer 160 may include, but are not limited to, AlN, GaN, GaAs, InN, AlGaN, AlInN, InGaN, AlInGaN or a combination thereof.

The quantum well layer 158 may include, but is not limited to, homojunction, heterojunction, single-quantum well (SQW), multiple-quantum well (MQW) or any other applicable structure. In some embodiments, the quantum well layer 158 includes un-doped n type $In_xGa_{(1-x)}N$. In other embodiments, the quantum well layer 158 includes such materials as $Al_xIn_yGa_{(1-x-y)}N$ and other materials. Moreover, the quantum well layer 158 may include a multiple-quantum well structure with multiple-quantum layers (such as InGaN) and barrier layers (such as GaN) arranged alternately. Moreover, the quantum well layer 158 may be formed by metalorganic chemical vapor deposition (MOCVD), molecular beam epitaxy (MBE), hydride vapor phase epitaxy (HVPE), liquid phase epitaxy (LPE) or any other applicable chemical vapor deposition process.

As shown in FIG. 1A, the light-emitting diode 152 may include a pad 162 and a pad 164. The pad 162 and the pad 164 may be disposed on the semiconductor layer 160 and the semiconductor layer 156, respectively. The pads 162 and 164 are configured to electrically connect the light-emitting diode 152 and other conductive elements. The material of the pads 162 and 164 may include, but is not limited to, copper (Cu), aluminum (Al), molybdenum (Mo), tungsten (W), gold (Au), chromium (Cr), nickel (Ni), platinum (Pt), titanium (Ti), tin (Sn) or another suitable metal material.

The laminated structure 100A may include a conductive layer 166 disposed on the insulation layer 140. The material of the conductive layer 166 may be similar to or the same as the metal layer 118. The conductive layer 166 may also include other conductive material, such as ITO. The conductive layer 166 may be used as a part of a conductive wire that be electrically connected to an electrode of the light-emitting diode 152 and the common voltage. The laminated structure 100A may include an insulation layer 150 disposed on the conductive layer 148. The insulation layer 150 is used to electrically isolate the conductive layer 148 and the conductive layer 166.

To be noted that a portion of the metal layers that are used to electrically connect the conductive layer 166 and the common voltage may be omitted. Forming the portion of the metal layers mentioned above may assist in improving the flatness of the laminated structure 100A, or may assist in simplifying the manufacturing process. The metal layer 116 and the metal layer 118 may be used as a part of a conductive wire that is electrically connected to the light-emitting diode 152. The metal layer 130 may be used as a part of the conductive wire that be electrically connected to the electrode of the light-emitting diode 152. The metal layer 144 may be used as a part of a conductive wire that be electrically connected to an electrode of the light-emitting diode 152. As shown in FIGS. 1A and 2, the S/D region 134 may be electrically connected to the drain voltage VDD; the S/D region 136 may be electrically connected to the light-emitting diode 152.

The laminated structure 100A may include a passivation layer 170, which is configured to reduce scratch of the laminated structure 100A. The passivation layer 170 may cover the light-emitting diode 152. The top surface of the passivation layer 170 may have a convex or a concave profile. The beam angle of the light-emitting diode 152 may be adjusted by modifying the profile of the top surface of the passivation layer 170. In this embodiment, the top surface of the passivation layer 170 may have a convex profile. The material of the passivation layer 170 may include silicon nitride, silicon oxide, silicon oxynitride or another suitable material.

The laminated structure 100A may include a light-emitting layer LEL above the first layer L1 and second layer L2. The light-emitting layer LEL includes a light-emitting diode 152. In some embodiments, the light-emitting layer LEL may further include at least a portion of the pixel define layer 146 or passivation layers 170. In other embodiments, the light-emitting layer LEL may further include at least a portion of the planarization layer 142 or filling layer 154.

In some embodiments, the light-emitting diode 152 may at least partially overlap the first thin film transistor circuit TFT1. In some embodiments, the light-emitting diode 152 does not overlap the semiconductor layer 138 of the second thin film transistor circuit TFT2. More specifically, the light-emitting diode 152 does not overlap the portion of the semiconductor layer 138 functioning as the channel of the second thin film transistor circuit TFT2. In addition, the term "overlap" is judged along a direction that is orthogonal to the substrate 102, such as the Z direction in this cross plane. More specifically, the first element overlaps the second element means that the first element overlaps the second element in the top view direction, such as the Z direction of the laminated structure 100A.

In some embodiments, the light-emitting diode 152 is disposed on the conductive layer 148 by a transfer method, which will be discussed below. During the transfer process of bonding the light-emitting diode 152, a pressure is generated pressing under elements. Since the light-emitting diode 152 does not overlap the semiconductor layer 138 of the second thin film transistor circuit TFT2, it reduces damage of the second thin film transistor circuit TFT2 during the transfer process In addition, since the light-emitting diode 152 overlaps at least portion of the first thin film transistor circuit TFT1, the size of the laminated structure 100A may be reduced. In some embodiments, there is a distance R1 between the light-emitting diode 152 and the first thin film transistor circuit TFT1. That is, when the laminated structure 100A has multiple thin film transistor circuits, the layout of the embodiments of the present disclosure may be used to dispose the thin film transistor circuits with two layers, such as first layer L1 and the second layer L2. More specifically, the R1 is the distance between the bottom surface of the pad 162 and the top surface of the semiconductor layer 112. The distance R1 may be in a range from 2 μm and 5 μm. When the distance R1 is in a range mentioned above, the intermediate layers, such as the passivation layer 114, the passivation layer 128, the insulation layer 140 and/or the planarization layer 142, can absorb the pressure induced by the transfer process so that the yield for manufacturing the laminated structure 100A could be improved.

Refer to FIG. 3, which illustrates a top view of the laminated structure 100A shown in FIG. 2 in accordance with some embodiments of the present disclosure. In some embodiments, in the top view, the light-emitting diode 152 may at least partially overlap two first thin film transistors; the light-emitting diode 152 does not overlap the semiconductor layer 138 of the second thin film transistor TFT21. In other embodiments, the light-emitting diode 152 may only partially overlap one of the thin film transistors. The light-emitting diode 152 may partially overlap the channel region 126 of the first thin film transistor TFT11. The line B-B' of FIG. 3 may correspond to the cross-sectional view shown in FIG. 2. There are a plurality of scan lines and data lines (not shown). The source of the first thin film transistor TFT11 and the second thin film transistor TFT21 may be electrically connected to the data lines; the gate of the first thin film transistor TFT11 and the second thin film transistor TFT21 may be electrically connected to the scan lines. In this embodiment, the first thin film transistor TFT11 may be the switch transistor ST; the second thin film transistor TFT21 may be the driving transistor DT. In addition, this embodiment may further include another first thin film transistor TFT12 that function as the reset transistor RT.

The electronic devices are not limited to the previous embodiments and may have various modified embodiments. The modified embodiments discussed below use the same labels as those of the previous embodiments with the same elements for brevity. To illustrate clearly the difference between different embodiments, the following paragraph will emphasize the difference between different embodiments, and the repeated portions are omitted.

Figure 4:
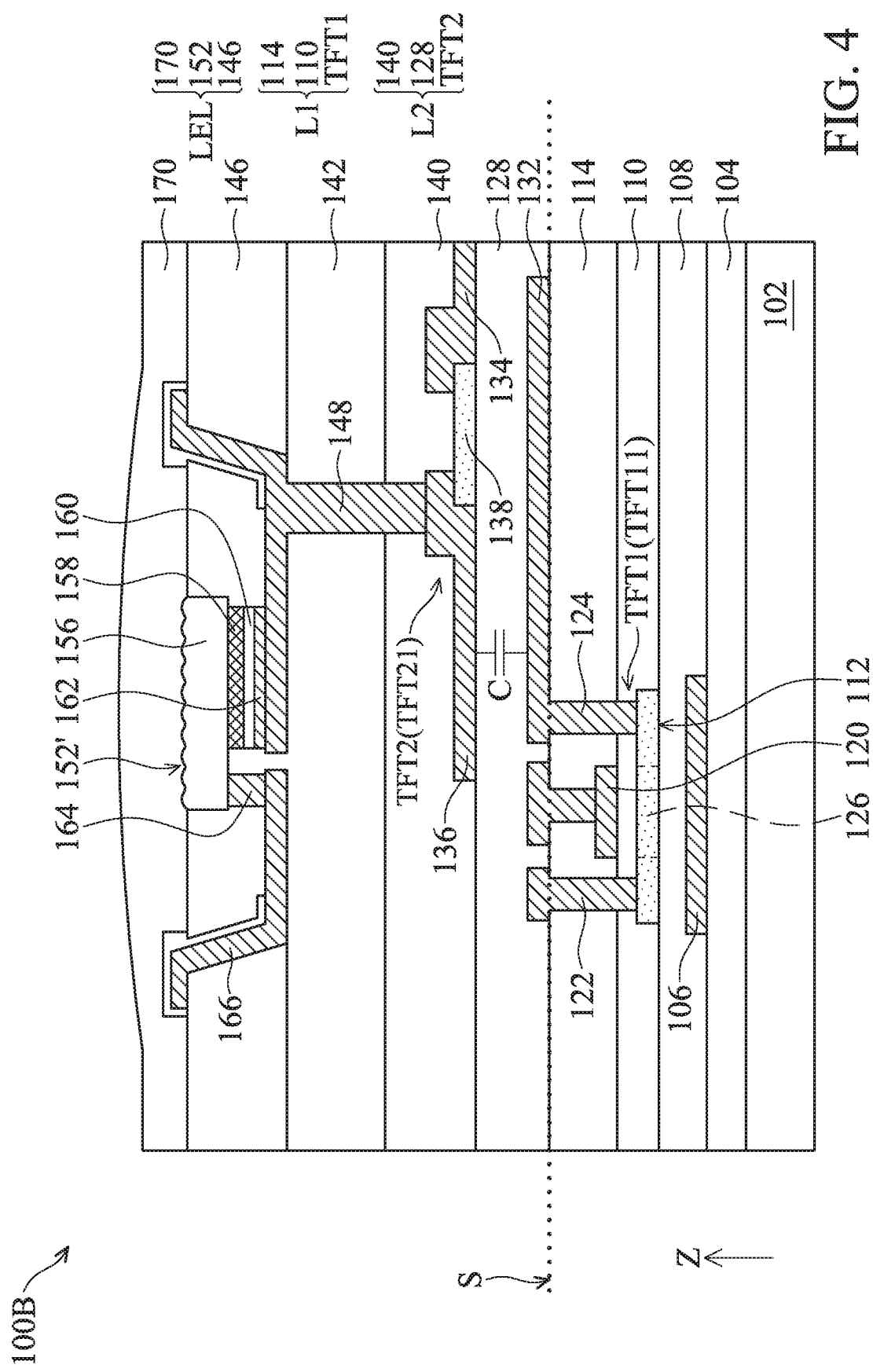
FIG. 4 illustrates a cross-sectional view of a laminated structure in accordance with some embodiments of the present disclosure.

Refer to FIG. 4, which illustrates a cross-sectional view of a laminated structure 100B in accordance with some embodiments of the present disclosure. One of the differences between the laminated structure 100A and the laminated structure 100B is that the laminated structure 100B may include a light-emitting diode 152' replacing the light-emitting diode 152. The conductive layer 166 may be electrically connected to the wire of the common voltage Vcom. As shown in FIG. 4, both the pads 162 and 164 of the light-emitting diode 152' may be disposed on the same side. More specifically, both the pads 162 and 164 of the light-emitting diode 152' are disposed between the semiconductor layer 156 and the second thin film transistor circuit TFT2. In this embodiment, the pad 162 may be electrically connected to the second thin film transistor circuit TFT2; the pad 164 may be electrically connected to the common voltage Vcom. The pads 162 and 164 may partially overlap the first thin film transistor circuit TFT1. The pads 162 and 164 may not overlap the semiconductor layer 138. In addition, the roughness of the semiconductor layer 156 is greater than that of the pixel define layer 146.

Figure 5:
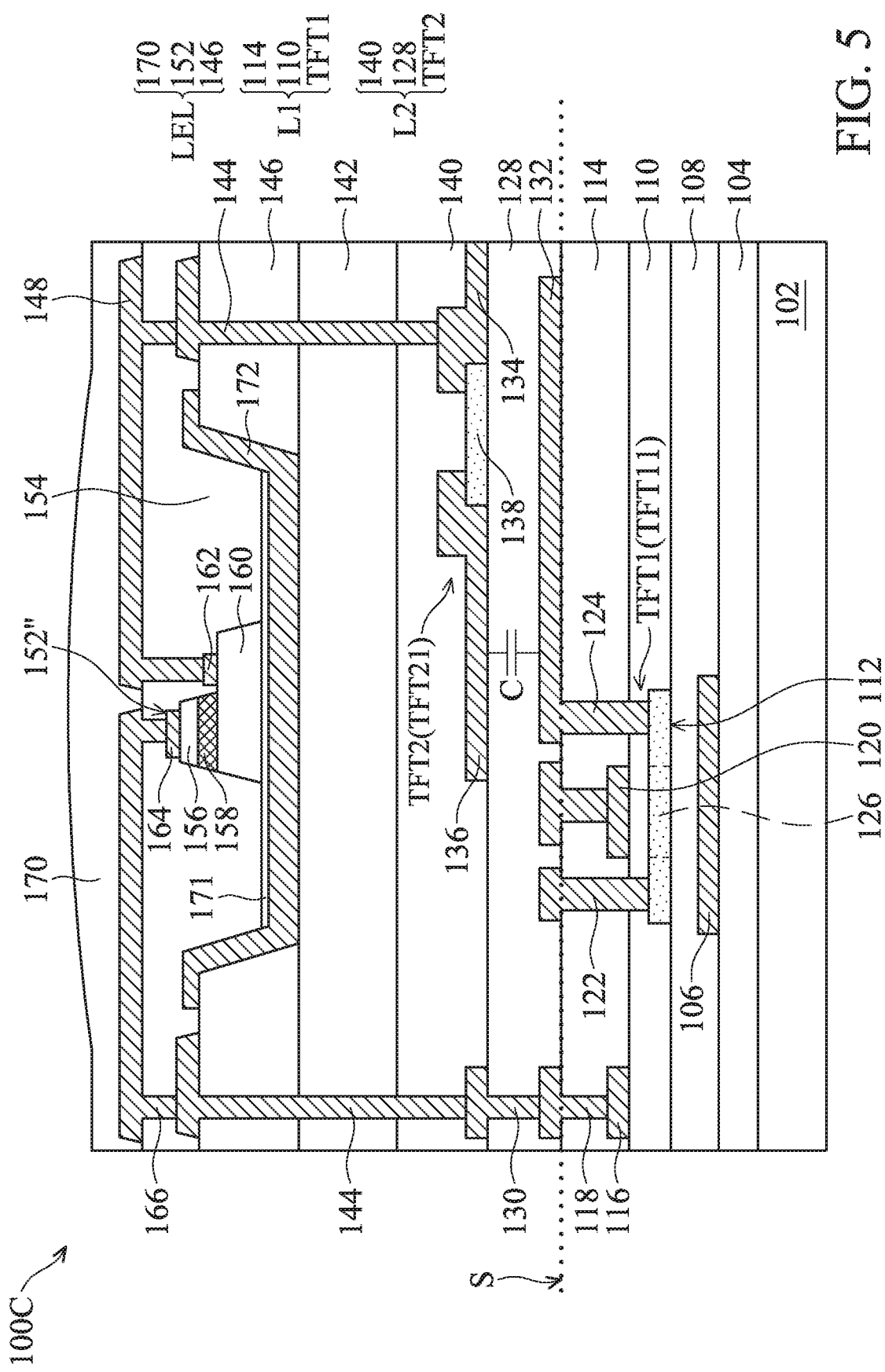
FIG. 5 illustrates a cross-sectional view of a laminated structure in accordance with some embodiments of the present disclosure.

Refer to FIG. 5, which illustrates a cross-sectional view of a laminated structure 100C in accordance with some embodiments of the present disclosure. One of the differences between the laminated structure 100A and the laminated structure 100C is that the laminated structure 100C may include a light-emitting diode 152" replacing the light-emitting diode 152. As shown in FIG. 5, both the pads 162 and 164 of the light-emitting diode 152" may be disposed on the same side. More specifically, the semiconductor layer 160 of the light-emitting diode 152" may be used to support the elements above. In some embodiments, the laminated structure 100C may further include a reflective layer 172. The reflective layer 172 may be disposed on the planarization layer 142. The material of the reflective layer 172 may include copper (Cu), aluminum (Al), molybdenum (Mo), gold (Au), titanium (Ti), or another suitable metal material. In some embodiments, a fixing layer 171 may be disposed between the reflective layer 172 and the semiconductor layer 160. The fixing layer 171 may be used to assist in fixing the light-emitting diode 152". The material of the fixing layer 171 may comprise resin, epoxy, silica gel, polyvinyl alcohol, polyurethane, acrylic resin, pressure-sensitive adhesive, hot-melt adhesive or other suitable material. In some embodiments, the surface of the semiconductor layer 160 that is closer to the reflective layer 172 may have a convex profile so that the semiconductor layer 160 could be embedded to the reflective layer 172. The reflective layer 172 is used to reflect light emitted from the light-emitting diode 152", which reduces the affection of the light-emitting diode 152 on the first thin film transistor circuit TFT1 and the second thin film transistor circuit TFT2.

Figure 6:
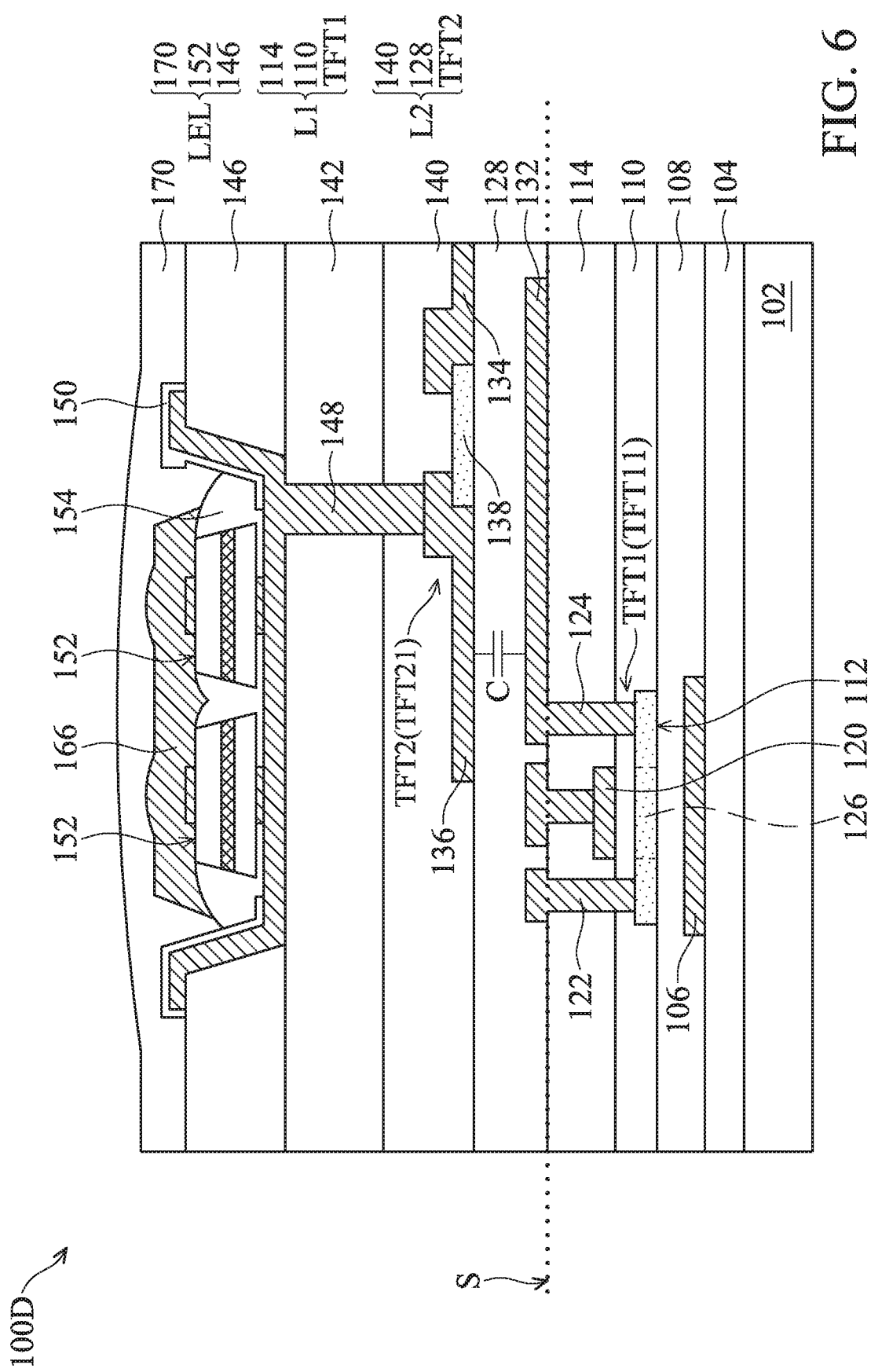
FIG. 6 illustrates a cross-sectional view of a laminated structure in accordance with some embodiments of the present disclosure.

Refer to FIG. 6, which illustrates a cross-sectional view of a laminated structure 100D in accordance with some embodiments of the present disclosure. One of the differences between the laminated structure 100A and the laminated structure 100D is that the laminated structure 100D may include two light-emitting diodes 152. In other embodiments, the laminated structure 100D may have more than two light-emitting diodes 152. The number of light-emitting diodes 152 is not intended to be limited. As shown in FIG. 6, both the light-emitting diode 152 may have common electrodes, such as the conductive layer 148 and the conductive layer 166. The conductive layer 166 may be electrically connected to at least one of two light-emitting diodes 152. The conductive layer 166 may be optionally electrically connected to one of the two light-emitting diodes 152. In this embodiment, the conductive layer 166 is electrically connected to both of the two light-emitting diodes 152.

Figure 7:
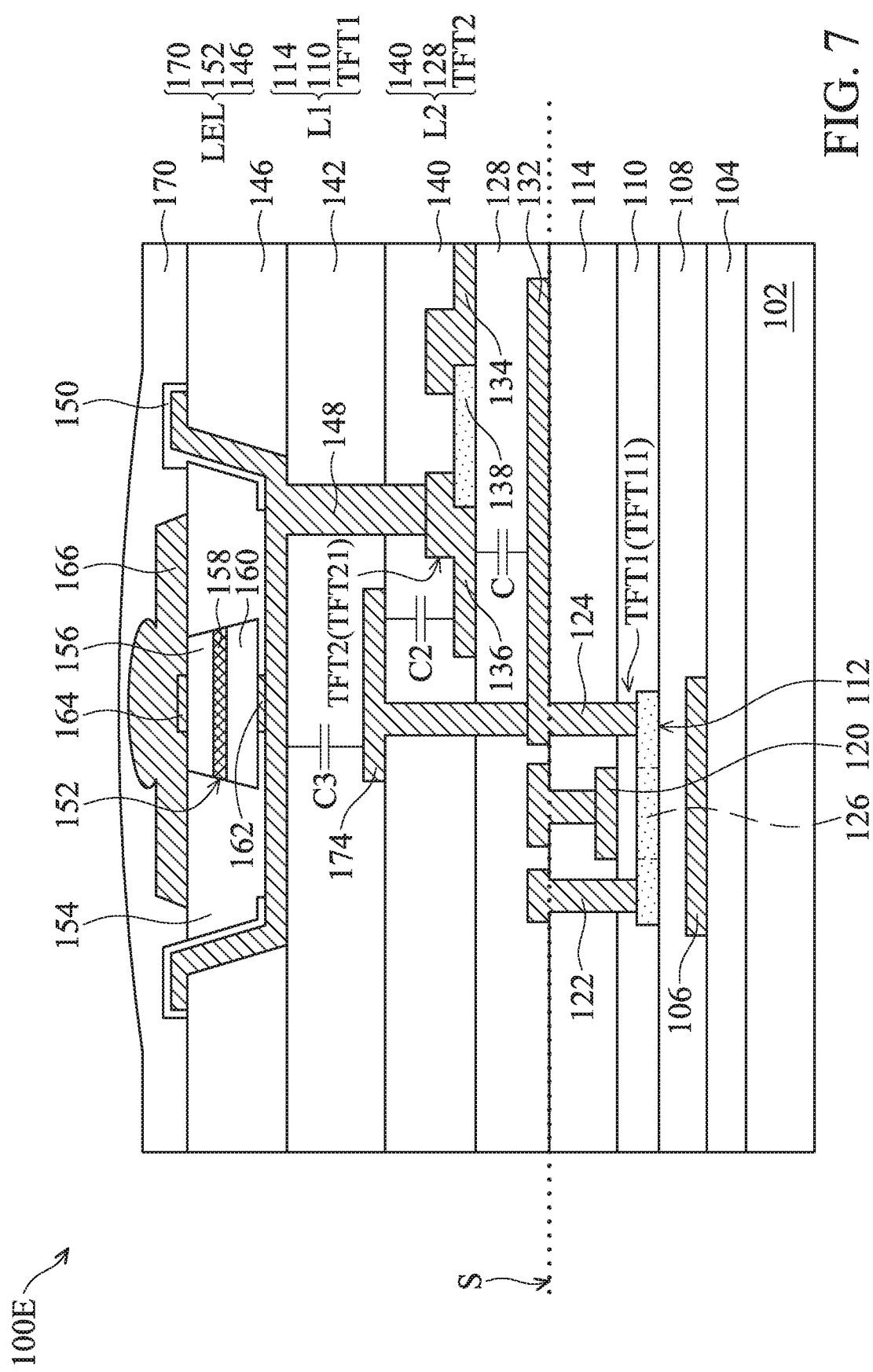
FIG. 7 illustrates a cross-sectional view of a laminated structure in accordance with some embodiments of the present disclosure.

Refer to FIG. 7, which illustrates a cross-sectional view of a laminated structure 100E in accordance with some embodiments of the present disclosure. One of the differences between the laminated structure 100A and the laminated structure 100E is that the laminated structure 100E may include a metal layer 174 disposed on the insulation layer 140. In some embodiments, there are capacitors C2 and C3. The capacitor C2 may be composed of the metal layer of the S/D region 136 of the second thin film transistor circuit TFT2, the insulation layer 140 and the metal layer 174; the capacitor C3 may be composed of the metal layer 174, the planarization layer 142 and the conductive layer 148. As more capacitors are formed, the laminated structure 100E becomes more stable.

Figure 8:
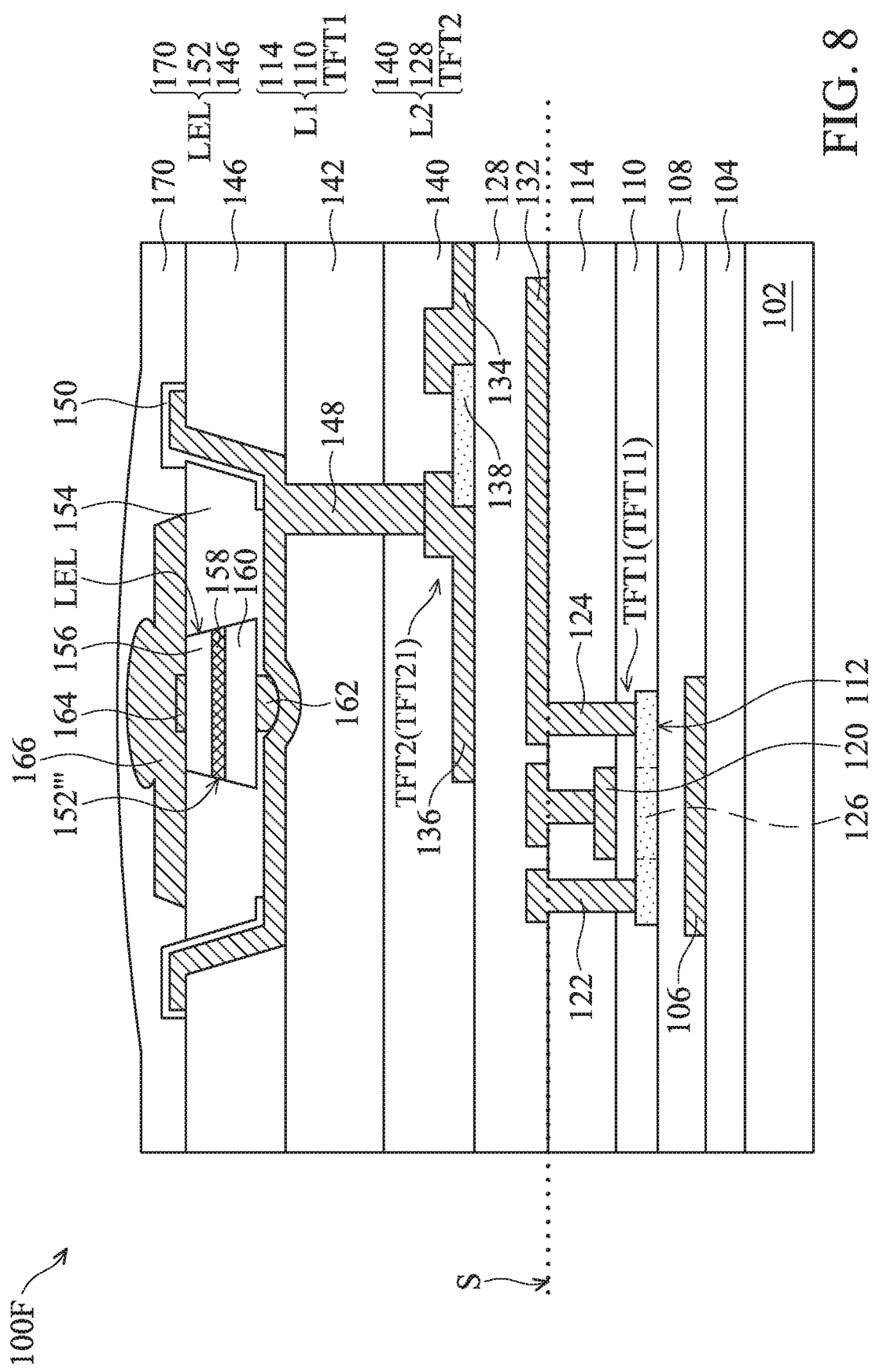
FIG. 8 illustrates a cross-sectional view of a laminated structure in accordance with some embodiments of the present disclosure.

Refer to FIG. 8, which illustrates a cross-sectional view of a laminated structure 100F in accordance with some embodiments of the present disclosure. One of the differences between the laminated structure 100A and the laminated structure 100F is that the laminated structure 100F may include a light-emitting diode 152'''. The pad 162 of the light-emitting diode 152''' may have a convex. In addition, the conductive layer 148 may have a concave corresponding to the convex of the pad 162. In some embodiments, the radius of curvature of the concave of the conductive layer 148 may be greater than that of the convex of the pad 162. This design may improve the accuracy for bonding the light-emitting diode 152''' or reduce the damage of the second thin film transistor circuit TFT2 during the transfer process. In some embodiments, the planarization layer 142 may have concave at corresponding portion, which improves the fixity of the light-emitting diode 152'''.

Refer back to FIG. 1B, the laminated structure 200 may include a plurality of pixels 201, and at least one of the plurality of pixels 201 may include at least four transistors, one capacitor and one light-emitting diode 152. One of the differences between the laminated structure 100 and the laminated structure 200 is that the laminated structure 200 may further include an emitting transistor ET and a reset transistor RT. The emitting transistor ET may be used to determine the magnitude of current to control the brightness of the light-emitting diode 152. The emitting transistor ET may be electrically connected to the drain voltage VDD and the driving transistor DT. In addition, the emitting transistor ET may be coupled to a node NC. The reset transistor RT may be used to let the current in the light-emitting diode 152 flow out when the light-emitting diode 152 is turned off. As a result, the light-emitting diode 152 will not emit light when the light-emitting diode 152 is turned off. The reset transistor RT may be electrically connected to a reset voltage Re-Set and coupled to a node ND. The reset transistor RT may be electrically connected to the light-emitting diode 152, the driving transistor DT and the capacitor through the node NA. To be noted that the circuit diagram of laminated structure 200 is merely an exemplary, and the scope of the disclosure is not intended to be limited. In some embodiments, the laminated structure 200 may further include other active and passive elements.

Figure 9:
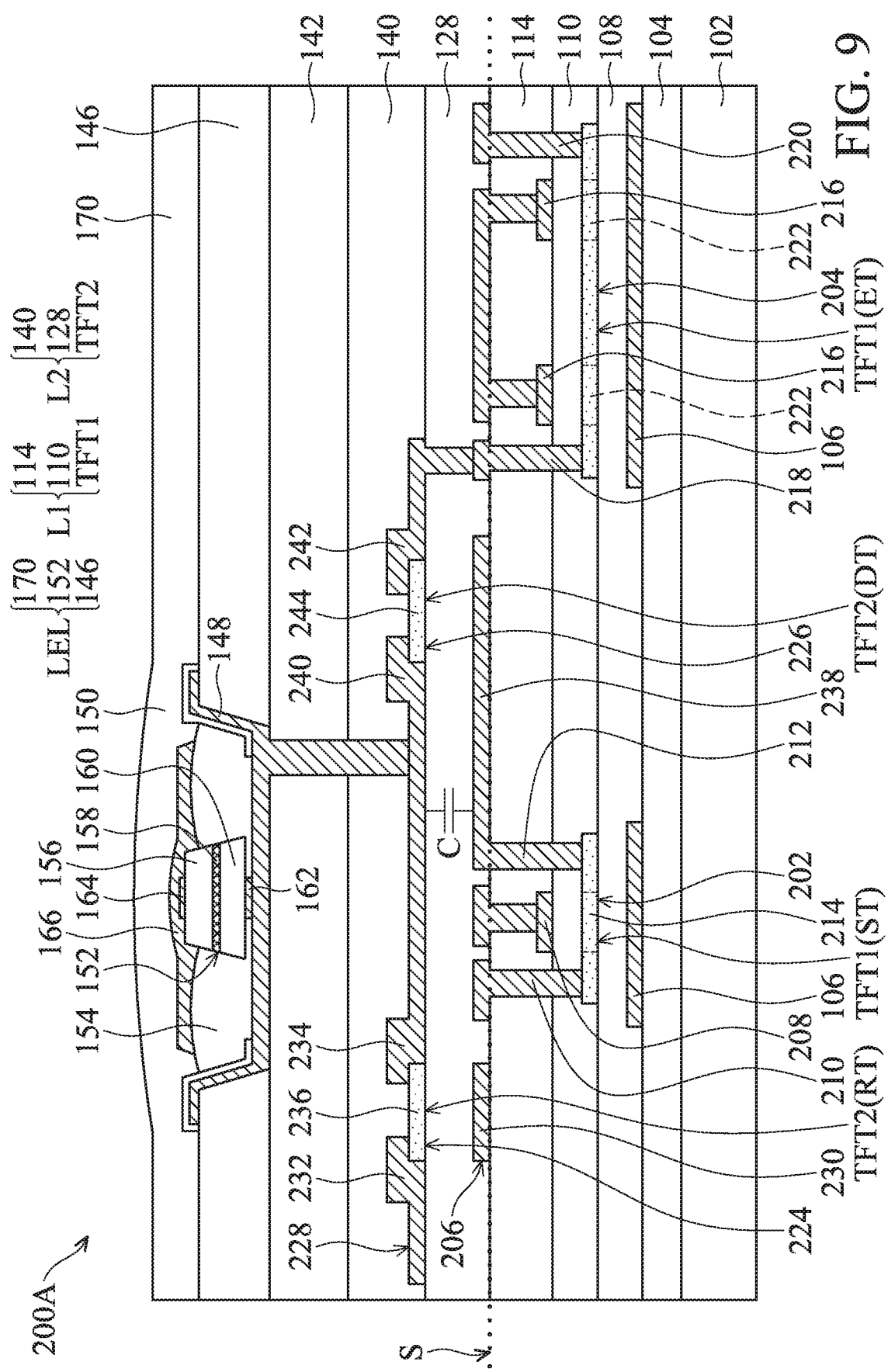
FIG. 9 illustrates a cross-sectional view of a laminated structure in accordance with some embodiments of the present disclosure.

Refer to FIG. 9, which illustrates a cross-sectional view of a laminated structure 200A in accordance with some embodiments of the present disclosure. As shown in FIG. 9, the laminated structure 200A may have the first layer L1, the second layer L2 and the light-emitting layer LEL. The second layer L2 is disposed between the first layer L1 and the light-emitting layer LEL. The first layer L1 and the second layer L2 may be similar to or the same as those of the laminated structure 100A, and are not repeated herein. The first layer L1 may include the first thin film transistor circuit TFT1, and the second layer L2 may include the second thin film transistor circuit TFT2. The light-emitting layer LEL may include the light-emitting diode 152.

The first thin film transistor circuit TFT1 may include a plurality of first thin film transistors, such as the switch transistor ST and the emitting transistor ET. The second thin film transistor circuit TFT2 may include a plurality of second thin film transistors, such as the reset transistor RT and the driving transistor DT. To be noted that the switch transistor ST, the emitting transistor ET, the reset transistor RT and/or the driving transistor DT may have a single gate structure, a double gate structure or a dual gate structure. Moreover, the semiconductor layer of the transistors, such as the switch transistor ST, the emitting transistor ET, the reset transistor RT and/or the driving transistor DT, may be used as the channel region plus source/drain, or may merely be used as the channel region. Whether the portion of the semiconductor layer of the switch transistor ST, the emitting transistor ET, the reset transistor RT and/or the driving transistor DT needs to be doped may depend on design of the layout. Therefore, the portions of the semiconductor layer out of the channel region may be used as the source and/or the drain. The scope of the disclosure is not intended to be limited.

The laminated structure 200A may include a semiconductor layer 202 and an semiconductor layer 204 disposed on the buffer layer 104. The material of the semiconductor layer 202 and the semiconductor layer 204 may be similar to or the same as that of the semiconductor layer 112. In some embodiments, the semiconductor layer 202 and the semiconductor layer 204 can be formed in the same process and be made of the same material. In some embodiments, the semiconductor layer 202 and/or the semiconductor layer 204 may be doped with p-type or n-type dopants. The laminated structure 200A may include a metal layer 206. In some embodiments, a portion of the metal layer 206 may be used as the source and the drain of the first thin film transistor circuit TFT1. In addition, a portion of the metal layer 206 may be used as the gate of the second thin film transistor circuit TFT2. However, the scope of the disclosure is not intended to be limited.

As shown in FIG. 9, the switch transistor ST may include a gate 208, a S/D region 210, a S/D region 212 and a semiconductor layer 202. The gate 208 may be disposed on the buffer layer 104. The S/D regions 210 and 212 are disposed on two opposite sides of the gate 208. As shown in FIGS. 1B and 9, the S/D region 210 may be electrically connected to the data line; the S/D region 212 may be electrically connected to the at least one of the second thin film transistor, such as the driving transistor DT. In this embodiment, the region of the semiconductor layer 202 that overlaps the gate 208 may be defined as the channel region 214 of the switch transistor ST.

As shown in FIG. 9, the emitting transistor ET may include a gate 216, a S/D region 218, a S/D region 220 and an semiconductor layer 204. The gate 216 may be disposed on the buffer layer 104. The S/D regions 218 and 220 are disposed on two opposite sides of the gate 216. As shown in FIGS. 1B and 9, the S/D region 218 may be electrically connected to at least one of the second thin film transistor, such as the driving transistor DT; the S/D region 220 may be electrically connected to the drain voltage VDD. In this embodiment, the region of the semiconductor layer 204 that overlaps the gate 216 may be defined as the channel region 222 of the emitting transistor ET.

The material of the gate 208 may be similar to or the same as that of the semiconductor layer 112. In some embodiments, the material of the semiconductor layer 202 and the semiconductor layer 204 can be formed in the same process and be made of the same material. In some embodiments, the material of the semiconductor layer 202 and the semiconductor layer 204 can be formed in the same process and be made of the same material.

The laminated structure 200A may include a semiconductor layer 224 and a semiconductor layer 226 disposed on the passivation layer 128. The material of the semiconductor layer 224 and the semiconductor layer 226 may be similar to or the same as that of the semiconductor layer 112. In some embodiments, the semiconductor layer 224 and the semiconductor layer 226 can be formed in the same process and be made of the same material. In some embodiments, the semiconductor layer 224 and/or the semiconductor layer 226 may be doped with p-type or n-type dopants. In some embodiments, the material of the semiconductor layer 202, the semiconductor layer 204, the semiconductor layer 224 and the semiconductor layer 226 can be made of the same material. In some embodiments, the material of the semiconductor layer 202, the semiconductor layer 204, the semiconductor layer 224 and the semiconductor layer 226 can be made of the different material. The laminated structure 200A may include a metal layer 228. In some embodiments, a portion of the metal layer 228 may be used as the source and the drain of the second thin film transistor circuit TFT2. However, the scope of the disclosure is not intended to be limited.

As shown in FIG. 9, the reset transistor RT may include a gate 230, a S/D region 232, a S/D region 234 and a semiconductor layer 224. The gate 230 may be disposed on the passivation layer 114. The S/D regions 232 and 234 are electrically connected to the semiconductor layer 224. As shown in FIGS. 1B and 9, the S/D region 232 may be electrically connected to the reset voltage Re-Set; the S/D region 234 may be electrically connected to the light-emitting diode 152 and/or the driving transistor DT. The semiconductor layer 224 overlaps the gate 230. In this embodiment, the whole semiconductor layer 224 may be used as the channel region 236.

As shown in FIG. 9, the driving transistor DT may include a gate 238, a S/D region 240, a S/D region 242 and an semiconductor layer 226. The gate 238 may be disposed on the passivation layer 114. The S/D regions 240 and 242 are electrically connected to the semiconductor layer 226. As shown in FIGS. 1B and 9, the S/D region 240 may be electrically connected to the light-emitting diode 152; the S/D region 242 may be electrically connected to the emitting transistor ET. The semiconductor layer 226 overlaps the gate 238. In this embodiment, the whole semiconductor layer 226 may be used as the channel region 244.

The relative position between the first thin film transistor circuit TFT1 and the second thin film transistor circuit TFT2 may be defined by their semiconductor layers as discussed in connection with FIG. 2, and is not repeated herein. In some embodiments, the light-emitting diode 152 may overlap the semiconductor layer of the first thin film transistor circuit TFT1. In some embodiments, the light-emitting diode 152 may overlap at least one of the first thin film transistor circuit TFT1. In some embodiments, the light-emitting diode 152 does not overlap the channel regions 236 and 244 of the second thin film transistor circuit TFT2 in a top view.

In this embodiment, the first thin film transistor circuit TFT1 includes the switch transistor ST and the emitting transistor ET. Therefore, the semiconductor layer 202 and the semiconductor layer 204 may be regarded as the semiconductor layer of the first thin film transistor circuit TFT1. In this embodiment, the second thin film transistor circuit TFT2 includes the reset transistor RT and the driving transistor DT. Therefore, the semiconductor layer 224 and the semiconductor layer 226 may be regarded as the semiconductor layer of the second thin film transistor circuit TFT2. In some embodiments, the material of the semiconductor layer of the first thin film transistor circuit TFT1 may be different from that of the second thin film transistor circuit TFT2. For example, the material of the semiconductor layer of the first thin film transistor circuit TFT1 may include LTPS; the material of the semiconductor layer of the second thin film transistor circuit TFT2 may include IGZO.

The exemplars of the species of the first thin film transistor circuit TFT1 and the second thin film transistor circuit TFT2 are not limited to aforementioned embodiments and may have different modified embodiments. To illustrate clearly the difference between different embodiments, the following paragraph will emphasize the difference between different embodiments, and the repeated portions are omitted.

Figure 10:
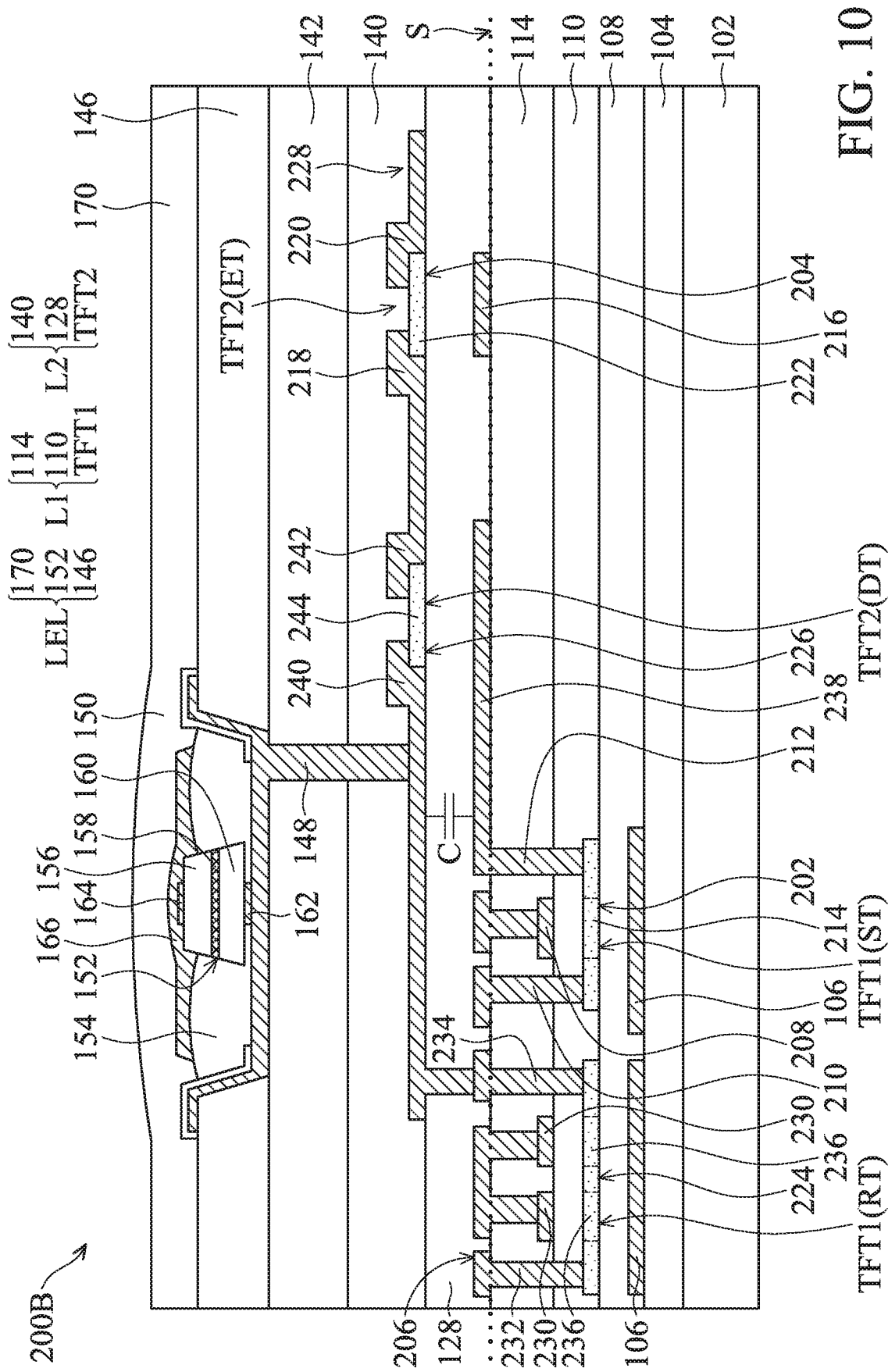
FIG. 10 illustrates a cross-sectional view of a laminated structure in accordance with some embodiments of the present disclosure.

Refer to FIG. 10, which illustrates a cross-sectional view of a laminated structure 200B in accordance with some embodiments of the present disclosure. One of the differences between the laminated structure 200B and the laminated structure 200A is the position of the thin film transistors. As shown in FIG. 10, the first thin film transistor circuit TFT1 may include the reset transistor RT and the switch transistor ST; the second thin film transistor circuit TFT2 may include the driving transistor DT and the emitting transistor ET. In addition, the differences also include that the reset transistor RT and the switch transistor ST of the first thin film transistor circuit TFT1 are located in the same side; the differences also include that the driving transistor DT and the emitting transistor ET of the second thin film transistor circuit TFT2 are located in the same side, wherein the side may be defined as the boundary where the connection between the conductive layer 148 and the light-emitting diode 152. In this embodiment, the reset transistor RT may have a double gate structure, and the emitting transistor ET may have a single gate structure. However, the scope of the disclosure is not intended to be limited.

Figure 11:
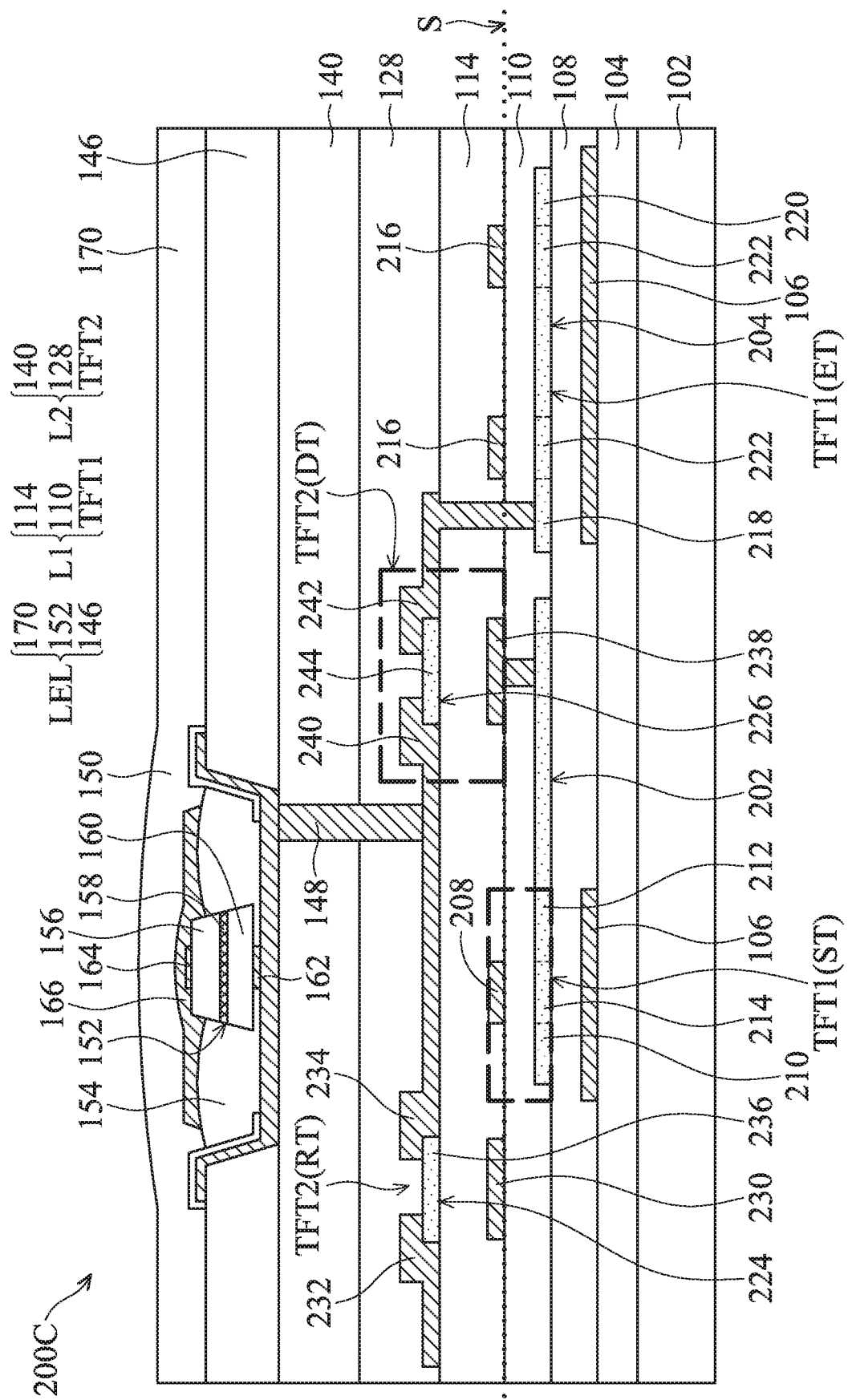
FIG. 11 illustrates a cross-sectional view of a laminated structure in accordance with some embodiments of the present disclosure.

Refer to FIG. 11, which illustrates a cross-sectional view of a laminated structure 200C in accordance with some embodiments of the present disclosure. One of the differences between the laminated structure 200C and the laminated structure 200A is that the gates of the reset transistor RT, the switch transistor ST, the driving transistor DT and the emitting transistor ET are all disposed on the gate insulating layer 110. Since the semiconductor layers 224 and 226 of the second thin film transistor circuit TFT2 are located above the semiconductor layers 202 and 204 of the first thin film transistor circuit TFT1, the first thin film transistor circuit TFT1 and the second thin film transistor circuit TFT2 may be defined as in different layers. As shown in FIG. 11, the region of the switch transistor ST may include the region marked by dotted line, which includes channel, defined by the region where the semiconductor layer 202 overlaps the gate 208, and least a portion of the gate 208, S/D regions 210 and 212. The region of the driving transistor DT may be defined in the same way. In this embodiment, the virtual interface S of the gate 238 may be defined by the interface between the gate insulating layer 110 and the passivation layer 114. To be noted that the region labeled as the switch transistor ST and/or the driving transistor DT in FIG. 11 is merely an exemplary, and the scope of the disclosure is not intended to be limited. In this embodiment, the S/D region 210, the S/D region 212 and the channel region 214 are made of the same material; the S/D region 218, the S/D region 220 and the channel region 222 are made of the same material. More specifically, the source/drain and the channel region of the first thin film transistor circuit TFT1 are made of the same material.

Figure 12:
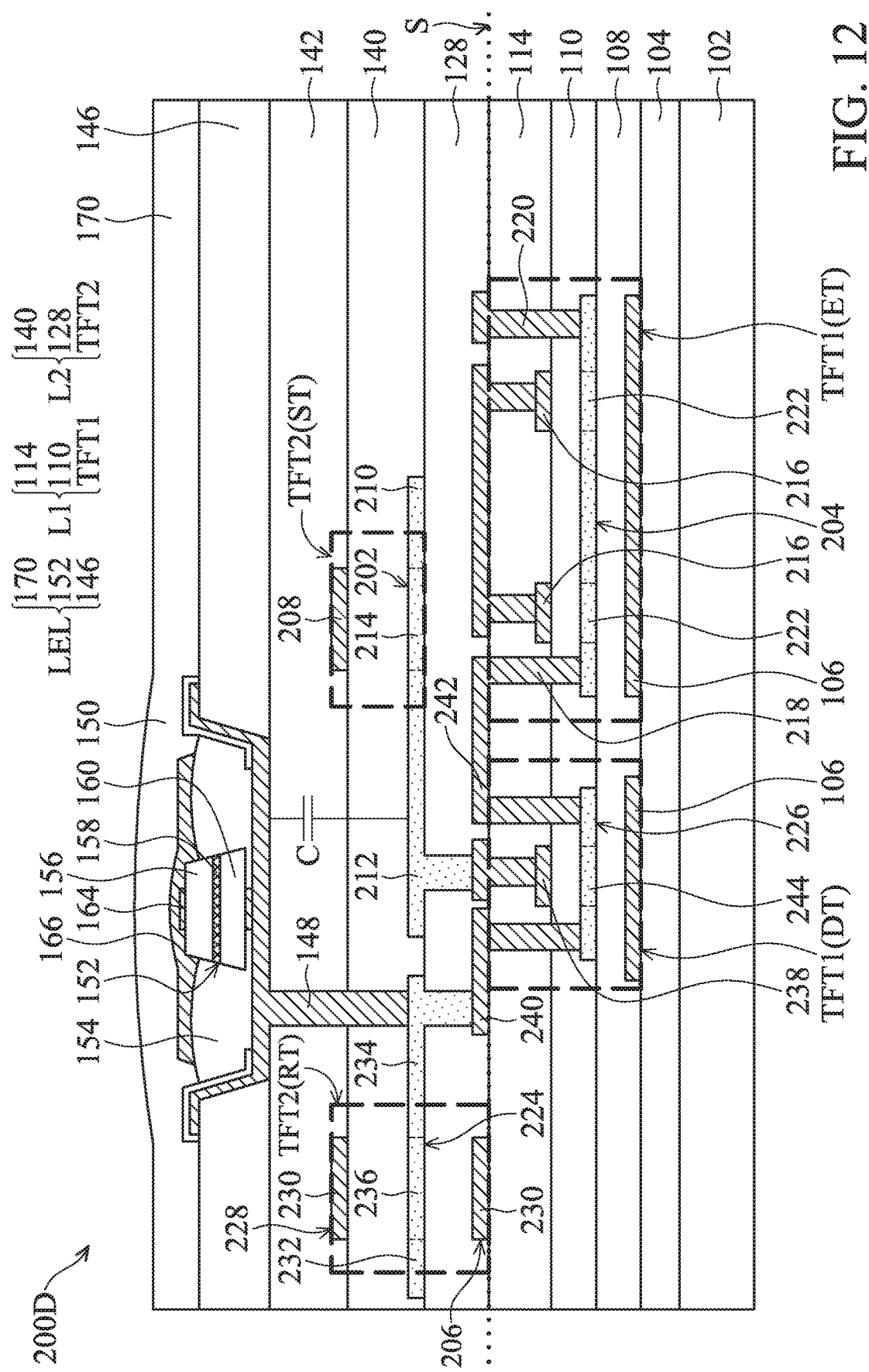
FIG. 12 illustrates a cross-sectional view of a laminated structure in accordance with some embodiments of the present disclosure.

Refer to FIG. 12, which illustrates a cross-sectional view of a laminated structure 200D in accordance with some embodiments of the present disclosure. One of the differences between the laminated structure 200D and the laminated structure 200A is that the position of the thin film transistors. As shown in FIG. 12, the first thin film transistor circuit TFT1 may include the driving transistor DT and the emitting transistor ET; the second thin film transistor circuit TFT2 may include the reset transistor RT and the switch transistor ST. More specifically, the semiconductor layer 226 may be regarded as the semiconductor layer of the first thin film transistor circuit TFT1; the semiconductor layer 202 may be regarded as the semiconductor layer of the second thin film transistor circuit TFT2.

The metal layer 206 may be used as the gate of the driving transistor RT In this embodiment, the reset transistor RT may have a dual gate structure. The metal layer 106 may be used as the gate of the driving transistor DT and the emitting transistor ET. The driving transistor DT and/or the emitting transistor ET may have a dual gate structure. However, the scope of the disclosure is not intended to be limited. To be noted that the region labeled as the switch transistor ST, the driving transistor DT, the emitting transistor ET and/or the reset transistor RT in FIG. 12 is merely an exemplary, and the scope of the disclosure is not intended to be limited. In this embodiment, the material of the semiconductor layer of the first thin film transistor circuit TFT1 may be the same as that of the second thin film transistor circuit TFT2. In this embodiment, the driving transistor DT is disposed much farther from the light-emitting diode 152. As a result, the stability during charging the laminated structure 200D may be improved.

Figure 13:
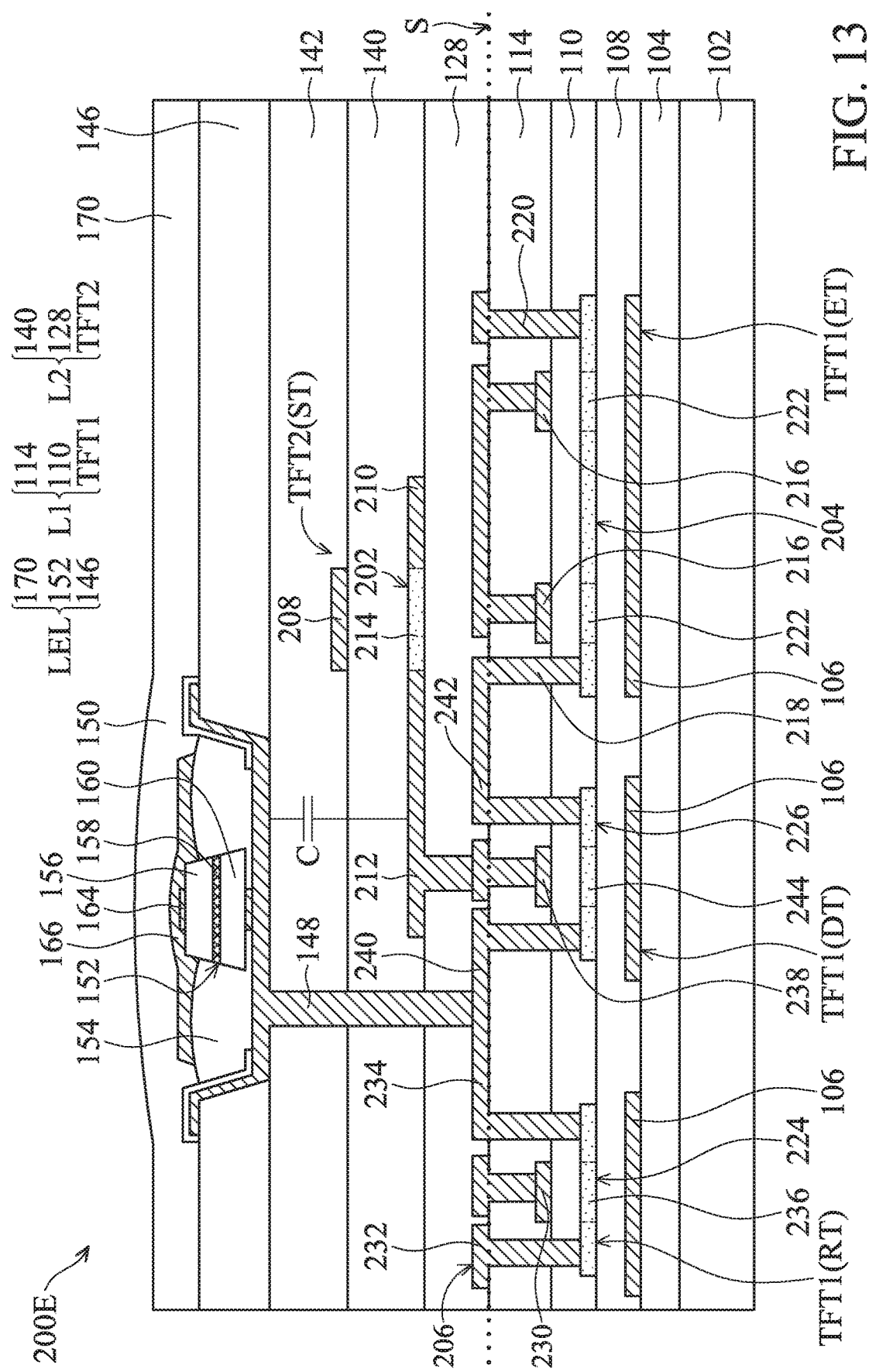
FIG. 13 illustrates a cross-sectional view of a laminated structure in accordance with some embodiments of the present disclosure.

Refer to FIG. 13, which illustrates a cross-sectional view of a laminated structure 200E in accordance with some embodiments of the present disclosure. One of the differences between the laminated structure 200E and the laminated structure 200D is that the position of the thin film transistors. In some embodiments, the number of first thin film transistors is greater than that of the second thin film transistors. As shown in FIG. 13, the first thin film transistor circuit TFT1 may include the reset transistor RT, the driving transistor DT and the emitting transistor ET; the second thin film transistor circuit TFT2 may include the switch transistor ST. Since the second thin film transistor circuit TFT2 has fewer transistors, the parasitic capacitance of the laminated structure 200E may be reduced.

Figure 14:
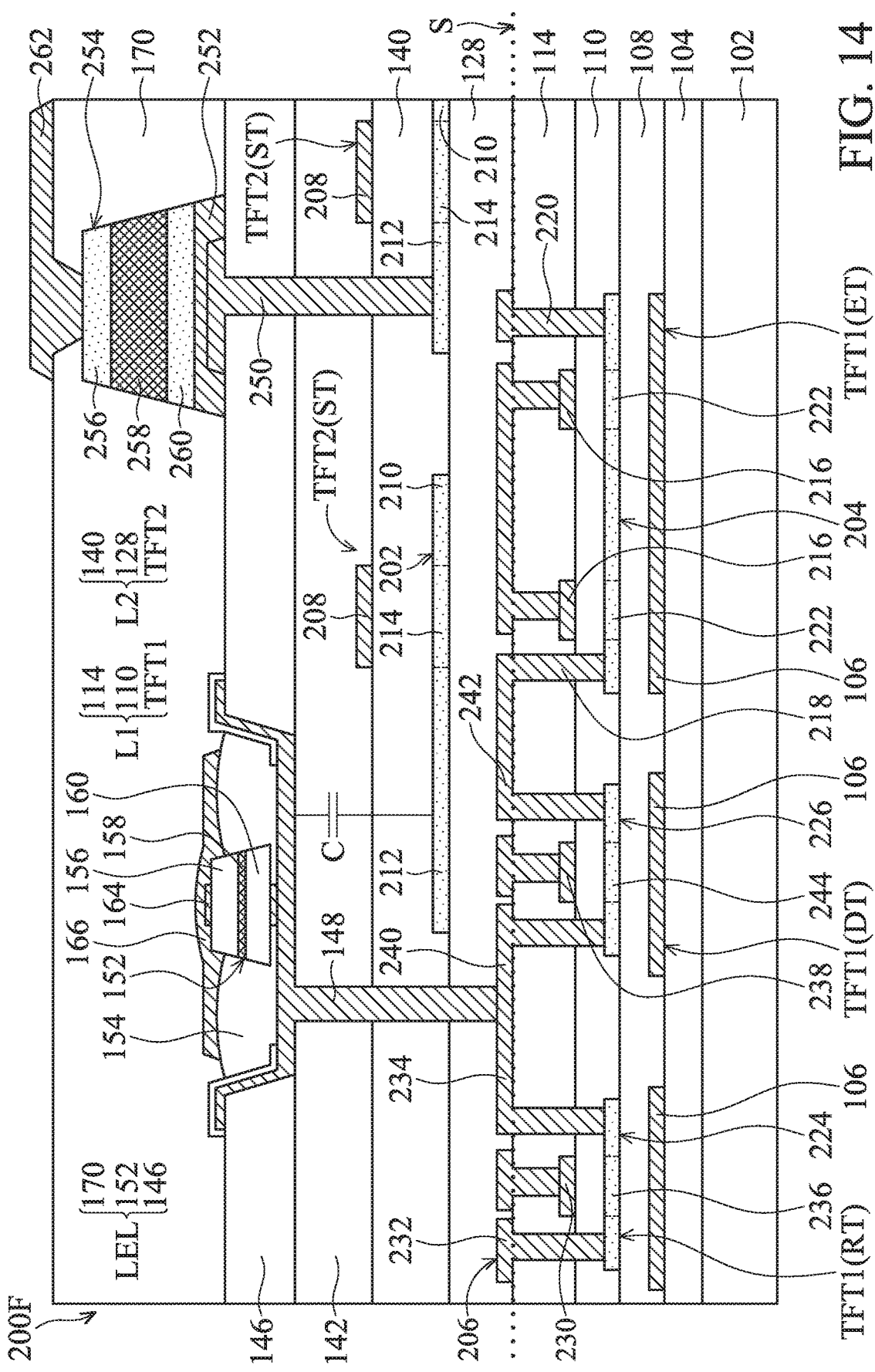
FIG. 14 illustrates a cross-sectional view of a laminated structure in accordance with some embodiments of the present disclosure.

Refer to FIG. 14, which illustrates a cross-sectional view of a laminated structure 200F in accordance with some embodiments of the present disclosure. One of the differences between the laminated structure 200F and the laminated structure 200D is that the laminated structure 200F further include a sensor 254. The sensor 254 may disposed on the second layer L2. The sensor 254 may be electrically connected to the second thin film transistor circuit TFT2, such as the switch transistor ST, through a conductive layer 250 and an electrode 252. The conductive layer 250 may include metal. The conductive layer 250 may also include other conductive material, such as ITO. The electrode 252 may include metal oxide, such as ITO. The sensor 254 may include a PIN diode. For example, the sensor 254 may have a semiconductor layer 256 with p-type dopant, an intrinsic semiconductor layer 258 that is not doped, and a semiconductor layer 260 with n-type dopant. The laminated structure 200F may further include an electrode 262 on the sensor 254. The electrode 262 may include metal oxide, such as ITO. However, the scope of the disclosure is not intended to be limited. The sensor 254 may be integrated on the laminated structure 200F so that the laminated structure 200F may be used as a surrounding sensor, a fingerprint sensor or a light-emitting sensing controller.

The transfer methods discussed below, such as wafer transfer, PDMS transfer, roll to roll process and electrostatic transfer, may be used by mixing with each other. The scope of the disclosure is not intended to be limited.

Refer to FIG. 15A-15C, which illustrate top views of different stages of a wafer transfer process for manufacturing an electronic device 300 in accordance with some embodiments of the present disclosure. As shown in FIG. 15A, a growth substrate 302 is provided. A plurality of light-emitting diodes 304 are epitaxially formed on the growth substrate 302. The growth substrate 302 may include a sapphire substrate. The light-emitting diode 304 may be similar as or the same as the light-emitting diode 152. The light-emitting diodes 304 may be patterned and then have a needed pitch. After the light-emitting diodes 304 are patterned, a target substrate 306 is provided as shown in FIG. 15B. As shown in FIG. 15C, the light-emitting diodes 304 may be transferred to the target substrate 306 from the growth substrate 302 by laser peeling process. As a result, the electronic device 300 is created.

Figure 16A:
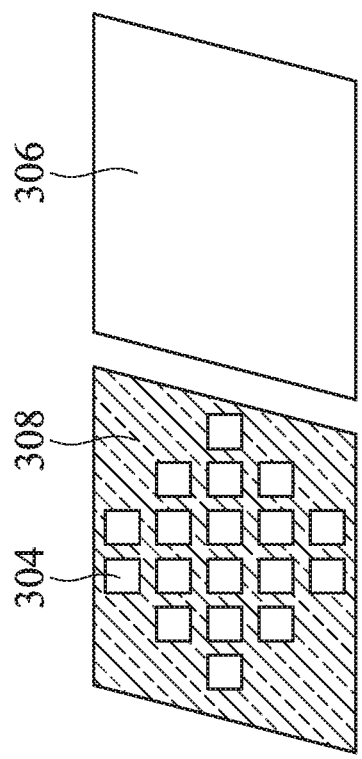
FIGS. 16A-16C illustrate top views of different stages of a process for manufacturing an electronic device in accordance with some embodiments of the present disclosure.
Figure 16B:
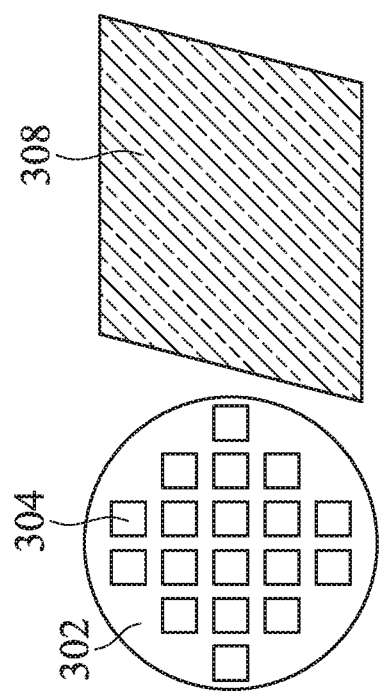
Figure 16C:
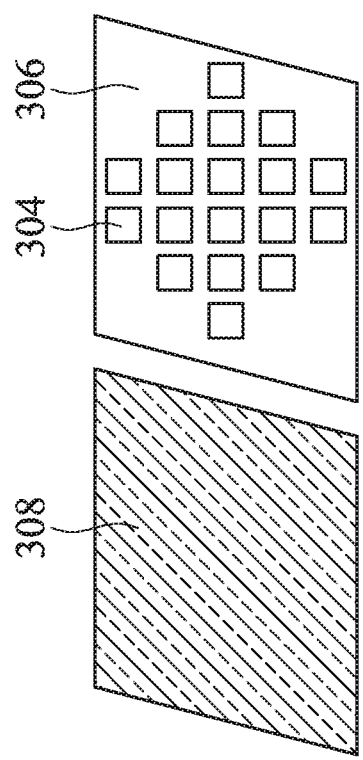

Refer to FIG. 16A-16C, which illustrate top views of different stages of a PDMS transfer process for manufacturing an electronic device 300 in accordance with some embodiments of the present disclosure. As shown in FIG. 16A, the growth substrate 302 with the plurality of light-emitting diode 304 is provided. In some embodiments, a carrier substrate 308 is provided during the transfer process. The carrier substrate 308 may include a polydimethylsiloxane (PDMS) substrate. The surface of the carrier substrate 308 may be adhesive. As shown in FIG. 16B, the light-emitting diodes 304 may be transferred to the carrier substrate 308 with a needed pitch and removed from the growth substrate 302. In this embodiment, the pitch of the light-emitting diodes 304 may be adjusted during the process shown from FIG. 16A to FIG. 16B. Next, the light-emitting diodes 304 may be transferred to the target substrate 306 from the carrier substrate 308. As a result, the electronic device 300 is created.

In some embodiments, the surface of the carrier substrate 308 may not be adhesive. An electrostatic transfer process may be used to transfer the light-emitting diodes 304. In this embodiment, the light-emitting diodes 304 may be transferred onto a carrier substrate 308 by the electrostatic force. Next, the light-emitting diodes 304 may be transferred to the target substrate 306.

Figure 17:
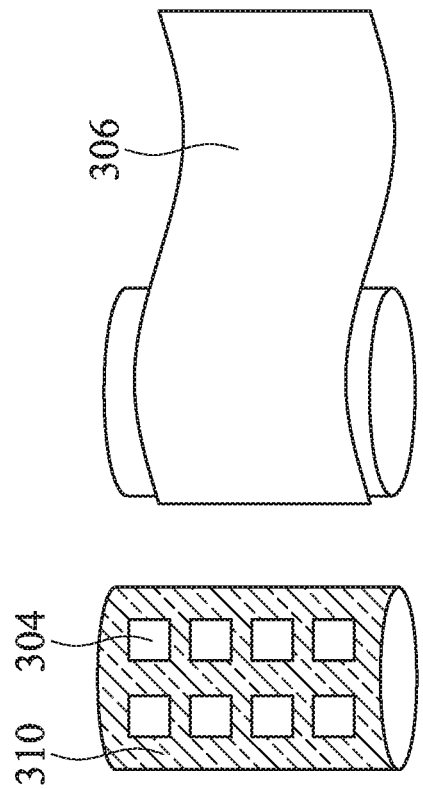
FIG. 17 illustrates a schematic view of one of the stages for manufacturing an electronic device in accordance with some embodiments of the present disclosure.

Refer to FIG. 17, which illustrate a schematic view of one of the stages of a roll to roll process for manufacturing an electronic device 300 in accordance with some embodiments of the present disclosure. As shown in FIG. 17, a carrier substrate 310 may be provided. The carrier substrate 310 may include a flexible substrate. The light-emitting diodes 304 may be transferred to the carrier substrate 310 from the growth substrate 302 at the beginning of the process. Next, a target substrate 306 is provided. The target substrate 306 may include a flexible substrate. Next, the plurality of light-emitting diodes 304 on the carrier substrate 310 may be transferred to the target substrate 306. As a result, the electronic device 300 is created.

The transfer process mentioned above may be used to transfer the light-emitting diode 152 onto the substrate 102. The aforementioned target substrates 306 may be the substrate 102. However, the scope of the disclosure is not intended to be limited.

Moreover, the laminated structures mentioned may be disposed in the electronic device. The electronic device may have a plurality of pixels, which emit different wavelength of light. Every pixel may have the laminated structures of the present disclosure. In some embodiments of the present disclosure, the light emitting diode at least partially overlaps with the first thin film transistor circuit and not overlap the channel region of the second thin film transistor circuit, thereby reducing the size of the laminated structure or preventing the second thin film transistor circuit from being damaged due to stress.

Although some embodiments of the present disclosure and their advantages have been described in detail, it should be understood that various changes, substitutions and alterations can be made herein without departing from the spirit and scope of the disclosure as defined by the appended claims.

What is claimed is:

1. A laminated structure, comprising:
    a light-emitting layer comprising a light emitting diode;
    a first layer comprising a first thin film transistor circuit; and
    a second layer comprising a second thin film transistor circuit, located between the light-emitting layer and the first layer, and the second thin film transistor circuit comprising a channel region;
    wherein the light emitting diode is at least partially overlapped with the first thin film transistor circuit and not overlapped with the channel region of the second thin film transistor circuit which is at least partially overlapped with the first thin film transistor circuit in a top view direction of the laminated structure.

2. The laminated structure according to claim 1, wherein the first thin film transistor circuit further comprises a plurality of first thin film transistors.

3. The laminated structure according to claim 2, further comprising:
a metal layer disposed under the first layer, wherein the metal layer overlaps the plurality of first thin film transistors.

4. The laminated structure according to claim 1, wherein the first thin film transistor circuit further comprises a plurality of first thin film transistors, the second thin film transistor circuit further comprises a plurality of second thin film transistors, and a number of the plurality of first thin film transistors is greater than a number of the plurality of second thin film transistors.

5. The laminated structure according to claim 1, wherein the first thin film transistor circuit further comprises a channel region, and the light emitting diode is at least partially overlapped with the channel region of the first thin film transistor circuit in the top view direction of the laminated structure.

6. The laminated structure according to claim 5, wherein a distance between the light emitting diode and the channel region of the first thin film transistor circuit is greater than 2 μm along the top view direction of the laminated structure.

7. The laminated structure according to claim 1, wherein the light emitting diode is disposed in the light-emitting layer by a transfer method.

8. The laminated structure according to claim 1, further comprising:
a sensor disposed on the second layer, wherein the sensor is electrically connected to the second thin film transistor circuit.

9. The laminated structure according to claim 1, wherein the second thin film transistor circuit further comprises a plurality of second thin film transistors.

10. The laminated structure according to claim 1, wherein the first thin film transistor circuit comprises a channel region, and wherein a material of the channel region of the first thin film transistor circuit is different from a material of the channel region of the second thin film transistor circuit.

11. An electronic device, comprising:
a plurality of pixels, and at least one of the plurality of pixels comprises a laminated structure, which comprises:
a light-emitting layer comprising a light emitting diode;
a first layer comprising a first thin film transistor circuit; and
a second layer comprising a second thin film transistor circuit, located between the light-emitting layer and the first layer, and the second thin film transistor circuit comprising a channel region;
wherein the light emitting diode is at least partially overlapped with the first thin film transistor circuit and not overlapped with the channel region of the second thin film transistor circuit which is at least partially overlapped with the first thin film transistor circuit in a top view direction of the laminated structure.

12. The electronic device according to claim 11, wherein the first thin film transistor circuit further comprises a plurality of first thin film transistors.

13. The electronic device according to claim 12, further comprising:
a metal layer disposed under the first layer, wherein the metal layer overlaps the plurality of first thin film transistors.

14. The electronic device according to claim 11, wherein the first thin film transistor circuit further comprises a plurality of first thin film transistors, the second thin film transistor circuit further comprises a plurality of second thin film transistors, and a number of the plurality of first thin film transistors is greater than a number of the plurality of second thin film transistors.

15. The electronic device according to claim 11, wherein the first thin film transistor circuit further comprises a channel region, and the light emitting diode is at least partially overlapped with the channel region of the first thin film transistor circuit in the top view direction of the laminated structure.

16. The electronic device according to claim 15, wherein a distance between the light emitting diode and the channel region of the first thin film transistor circuit is greater than 2 μm along the top view direction of the laminated structure.

17. The electronic device according to claim 11, wherein the light emitting diode is disposed in the light-emitting layer by a transfer method.

18. The electronic device according to claim 11, further comprising:
a sensor disposed on the second layer, wherein the sensor is electrically connected to the second thin film transistor circuit.

19. The electronic device according to claim 11, wherein the second thin film transistor circuit further comprises a plurality of second thin film transistors.

20. The electronic device according to claim 11, wherein the first thin film transistor circuit comprises a channel region, and wherein a material of the channel region of the first thin film transistor circuit is different from a material of the channel region of the second thin film transistor circuit.

* * * * *